US012603725B2

(12) United States Patent
Yapici et al.

(10) Patent No.: US 12,603,725 B2
(45) Date of Patent: Apr. 14, 2026

(54) REDUNDANCY CONFIGURATIONS FOR NON-COHERENT TRANSMISSIONS BETWEEN NETWORK DEVICES

(71) Applicant: QUALCOMM Incorporated, San Diego, CA (US)

(72) Inventors: Yavuz Yapici, Florham Park, NJ (US); Juergen Cezanne, Ocean Township, NJ (US); Junyi Li, Greentown, PA (US)

(73) Assignee: QUALCOMM Incorporated, San Diego, CA (US)

( * ) Notice: Subject to any disclaimer, the term of this patent is extended or adjusted under 35 U.S.C. 154(b) by 97 days.

(21) Appl. No.: 18/792,419

(22) Filed: Aug. 1, 2024

(65) Prior Publication Data

US 2026/0039417 A1 Feb. 5, 2026

(51) Int. Cl.
*H04L 1/00* (2006.01)
*H03M 13/09* (2006.01)

(52) U.S. Cl.
CPC ........ *H04L 1/0061* (2013.01); *H03M 13/091* (2013.01)

(58) Field of Classification Search
CPC ... H04L 1/0061; H04L 1/0071; H04L 1/0078; H04L 5/0057; H04L 5/0023
See application file for complete search history.

(56) References Cited

U.S. PATENT DOCUMENTS

| | | | |
|---|---|---|---|
| 2021/0119840 A1* | 4/2021 | Landis ................. | H04B 7/0626 |
| 2024/0147466 A1* | 5/2024 | Zhang ................... | H04L 5/0053 |
| 2025/0220582 A1* | 7/2025 | Li ......................... | H04W 68/02 |

OTHER PUBLICATIONS

Na Li et al., Resource optimization for Noncoherent short-packet communication with IR-HARQ, IEEE, pp. 1 to 5 (Year: 2021).*
Fawaz et al., The Non-coherent wideband multipath fading relay channel, IEEE, pp. 679-683. (Year: 2010).*

* cited by examiner

*Primary Examiner* — Shelly A Chase
(74) *Attorney, Agent, or Firm* — Paul M. McAdams; Polsinelli

(57) ABSTRACT

Systems and techniques are provided for wireless communications. For example, a network device can receive configuration information for redundancy bits associated with scheduled non-coherent transmissions. The network device can receive a plurality of non-coherent transmissions corresponding to a message, the message including a plurality of data bits and a plurality of redundancy bits, wherein each non-coherent transmission of the plurality of non-coherent transmissions is associated with a duty cycle corresponding to the scheduled non-coherent transmissions. The network device can determine error control information for one or more data bits of the plurality of data bits using corresponding redundancy bits of the plurality of redundancy bits, wherein the corresponding redundancy bits are determined based on the configuration information.

20 Claims, 12 Drawing Sheets

1000

Receive configuration information for redundancy bits associated with scheduled non-coherent transmissions
1002

Receive a plurality of non-coherent transmissions corresponding to a message, the message including a plurality of data bits and a plurality of redundancy bits, wherein each non-coherent transmission of the plurality of non-coherent transmissions is associated with a duty cycle corresponding to the scheduled non-coherent transmissions
1004

Determine error control information for one or more data bits of the plurality of data bits using corresponding redundancy bits of the plurality of redundancy bits, wherein the corresponding redundancy bits are determined based on the configuration information
1006

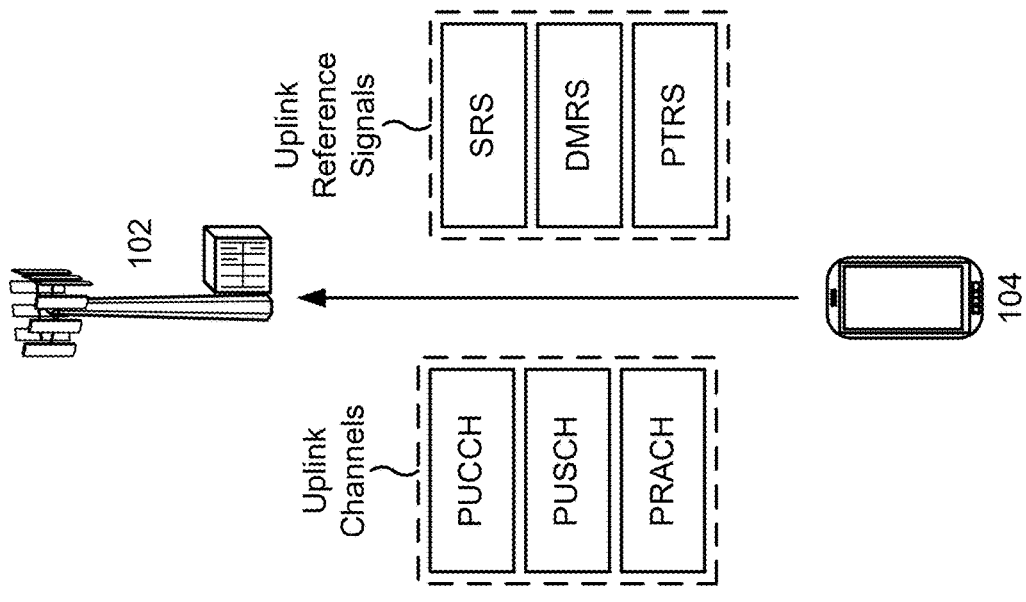
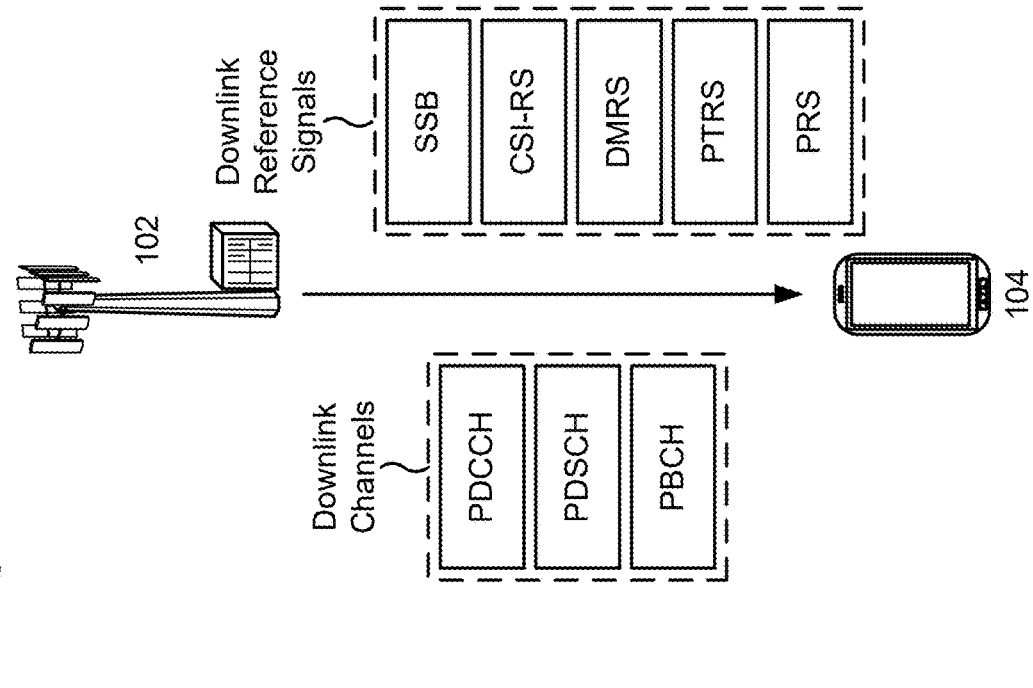
FIG. 5

1000

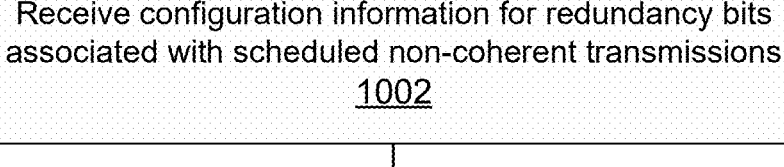

Receive configuration information for redundancy bits
associated with scheduled non-coherent transmissions
1002

Receive a plurality of non-coherent transmissions
corresponding to a message, the message including a
plurality of data bits and a plurality of redundancy bits,
wherein each non-coherent transmission of the plurality of
non-coherent transmissions is associated with a duty cycle
corresponding to the scheduled non-coherent transmissions
1004

Determine error control information for one or more data bits
of the plurality of data bits using corresponding redundancy
bits of the plurality of redundancy bits, wherein the
corresponding redundancy bits are determined based on
the configuration information
1006

Transmit configuration information for redundancy bits associated with scheduled non-coherent transmissions
1102

Transmit a plurality of non-coherent transmissions corresponding to a message, the message including a plurality of data bits and a plurality of redundancy bits, wherein each non-coherent transmission of the plurality of non-coherent transmissions is associated with a duty cycle corresponding to the scheduled non-coherent transmissions
1104

Receive a request for retransmission of one or more non-coherent transmissions of the plurality of non-coherent transmissions, the request based on error control information determined for one or more data bits of the plurality of data bits using corresponding redundancy bits selected from the plurality of redundancy bits based on the configuration information
1106

FIG. 11

REDUNDANCY CONFIGURATIONS FOR NON-COHERENT TRANSMISSIONS BETWEEN NETWORK DEVICES

FIELD

Aspects of the present disclosure generally relate to wireless communication. In some implementations, examples are described for redundancy bit configuration and/or management for non-coherent (e.g., peaky) transmissions between network devices.

INTRODUCTION

Wireless communications systems are deployed to provide various telecommunication services, including telephony, video, data, messaging, broadcasts, among others. Wireless communications systems have developed through various generations, including a first-generation analog wireless phone service (1G), a second-generation (2G) digital wireless phone service (including interim 2.5G networks), a third-generation (3G) high speed data, Internet-capable wireless service, a fourth-generation (4G) service (e.g., Long-Term Evolution (LTE), WiMax), and a fifth-generation (5G) service (e.g., New Radio (NR)). There are presently many different types of wireless communications systems in use, including cellular and personal communications service (PCS) systems. Examples of known cellular systems include the cellular Analog Advanced Mobile Phone System (AMPS), and digital cellular systems based on code division multiple access (CDMA), frequency division multiple access (FDMA), time division multiple access (TDMA), the Global System for Mobile communication (GSM), etc.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

Disclosed are systems, methods, apparatuses, and computer-readable media for performing wireless communication. According to at least one illustrative example, a network device for wireless communication is provided. The network device includes at least one memory and at least one processor coupled to the at least one memory. The at least one processor is configured to: receive configuration information for redundancy bits associated with scheduled non-coherent transmissions; receive a plurality of non-coherent transmissions corresponding to a message, the message including a plurality of data bits and a plurality of redundancy bits, wherein each non-coherent transmission of the plurality of non-coherent transmissions is associated with a duty cycle corresponding to the scheduled non-coherent transmissions; and determine error control information for one or more data bits of the plurality of data bits using corresponding redundancy bits of the plurality of redundancy bits, wherein the corresponding redundancy bits are determined based on the configuration information.

In another example, a method for wireless communication is provided, the method including: receiving configuration information for redundancy bits associated with scheduled non-coherent transmissions; receiving a plurality of non-coherent transmissions corresponding to a message, the message including a plurality of data bits and a plurality of redundancy bits, wherein each non-coherent transmission of the plurality of non-coherent transmissions is associated with a duty cycle corresponding to the scheduled non-coherent transmissions; and determining error control information for one or more data bits of the plurality of data bits using corresponding redundancy bits of the plurality of redundancy bits, wherein the corresponding redundancy bits are determined based on the configuration information.

In another example, a non-transitory computer-readable storage medium comprising instructions stored thereon which, when executed by at least one processor, causes the at least one processor to: receive configuration information for redundancy bits associated with scheduled non-coherent transmissions; receive a plurality of non-coherent transmissions corresponding to a message, the message including a plurality of data bits and a plurality of redundancy bits, wherein each non-coherent transmission of the plurality of non-coherent transmissions is associated with a duty cycle corresponding to the scheduled non-coherent transmissions; and determine error control information for one or more data bits of the plurality of data bits using corresponding redundancy bits of the plurality of redundancy bits, wherein the corresponding redundancy bits are determined based on the configuration information.

In another example, an apparatus is provided for wireless communication. The apparatus includes: means for receiving configuration information for redundancy bits associated with scheduled non-coherent transmissions; means for receiving a plurality of non-coherent transmissions corresponding to a message, the message including a plurality of data bits and a plurality of redundancy bits, wherein each non-coherent transmission of the plurality of non-coherent transmissions is associated with a duty cycle corresponding to the scheduled non-coherent transmissions; and means for determining error control information for one or more data bits of the plurality of data bits using corresponding redundancy bits of the plurality of redundancy bits, wherein the corresponding redundancy bits are determined based on the configuration information.

According to at least one illustrative example, a network entity for wireless communication is provided. The network entity includes at least one memory and at least one processor coupled to the at least one memory. The at least one processor is configured to: transmit configuration information for redundancy bits associated with scheduled non-coherent transmissions; transmit a plurality of non-coherent transmissions corresponding to a message, the message including a plurality of data bits and a plurality of redundancy bits, wherein each non-coherent transmission of the plurality of non-coherent transmissions is associated with a duty cycle corresponding to the scheduled non-coherent transmissions; and receive a request for retransmission of one or more non-coherent transmissions of the plurality of non-coherent transmissions, the request based on error control information determined for one or more data bits of the plurality of data bits using corresponding redundancy bits selected from the plurality of redundancy bits based on the configuration information.

In another example, a method for wireless communication is provided, the method including: transmitting configuration information for redundancy bits associated with scheduled non-coherent transmissions; transmitting a plurality of non-coherent transmissions corresponding to a message, the message including a plurality of data bits and a plurality of redundancy bits, wherein each non-coherent transmission of the plurality of non-coherent transmissions is associated with a duty cycle corresponding to the scheduled non-coherent transmissions; and receiving a request for retransmission of one or more non-coherent transmissions of the plurality of non-coherent transmissions, the request based on error control information determined for one or more data bits of the plurality of data bits using corresponding redundancy bits selected from the plurality of redundancy bits based on the configuration information.

In another example, a non-transitory computer-readable storage medium comprising instructions stored thereon which, when executed by at least one processor, causes the at least one processor to: transmit configuration information for redundancy bits associated with scheduled non-coherent transmissions; transmit a plurality of non-coherent transmissions corresponding to a message, the message including a plurality of data bits and a plurality of redundancy bits, wherein each non-coherent transmission of the plurality of non-coherent transmissions is associated with a duty cycle corresponding to the scheduled non-coherent transmissions; and receive a request for retransmission of one or more non-coherent transmissions of the plurality of non-coherent transmissions, the request based on error control information determined for one or more data bits of the plurality of data bits using corresponding redundancy bits selected from the plurality of redundancy bits based on the configuration information.

In another example, an apparatus is provided for wireless communication. The apparatus includes: means for transmitting configuration information for redundancy bits associated with scheduled non-coherent transmissions; means for transmitting a plurality of non-coherent transmissions corresponding to a message, the message including a plurality of data bits and a plurality of redundancy bits, wherein each non-coherent transmission of the plurality of non-coherent transmissions is associated with a duty cycle corresponding to the scheduled non-coherent transmissions; and means for receiving a request for retransmission of one or more non-coherent transmissions of the plurality of non-coherent transmissions, the request based on error control information determined for one or more data bits of the plurality of data bits using corresponding redundancy bits selected from the plurality of redundancy bits based on the configuration information.

Aspects generally include a method, apparatus, system, computer program product, non-transitory computer-readable medium, user equipment, base station, wireless communication device, and/or processing system as substantially described herein with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages, will be better understood from the following description when considered in connection with the accompanying figures. Each of the figures is provided for the purposes of illustration and description, and not as a definition of the limits of the claims.

While aspects are described in the present disclosure by illustration to some examples, those skilled in the art will understand that such aspects may be implemented in many different arrangements and scenarios. Techniques described herein may be implemented using different platform types, devices, systems, shapes, sizes, and/or packaging arrangements. For example, some aspects may be implemented via integrated chip implementations or other non-module-component based devices (e.g., end-user devices, vehicles, communication devices, computing devices, industrial equipment, retail/purchasing devices, medical devices, and/or artificial intelligence devices). Aspects may be implemented in chip-level components, modular components, non-modular components, non-chip-level components, device-level components, and/or system-level components. Devices incorporating described aspects and features may include additional components and features for implementation and practice of claimed and described aspects. For example, transmission and reception of wireless signals may include one or more components for analog and digital purposes (e.g., hardware components including antennas, radio frequency (RF) chains, power amplifiers, modulators, buffers, processors, interleavers, adders, and/or summers). It is intended that aspects described herein may be practiced in a wide variety of devices, components, systems, distributed arrangements, and/or end-user devices of varying size, shape, and constitution.

Other objects and advantages associated with the aspects disclosed herein will be apparent to those skilled in the art based on the accompanying drawings and detailed description. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

The foregoing, together with other features and aspects, will become more apparent upon referring to the following specification, claims, and accompanying drawings.

BRIEF DESCRIPTION OF THE DRAWINGS

The accompanying drawings are presented to aid in the description of various aspects of the disclosure and are provided solely for illustration of the aspects and not limitation thereof.

FIG. 5 is a diagram illustrating an example of physical channels and reference signals in a wireless network, in accordance with some examples;

FIG. 10 is a flowchart diagram illustrating an example of a process for wireless communications by a network device, in accordance with some examples;

FIG. 11 is a flowchart diagram illustrating an example of a process for wireless communications by a network entity, in accordance with some examples.

DETAILED DESCRIPTION

Figure 1:
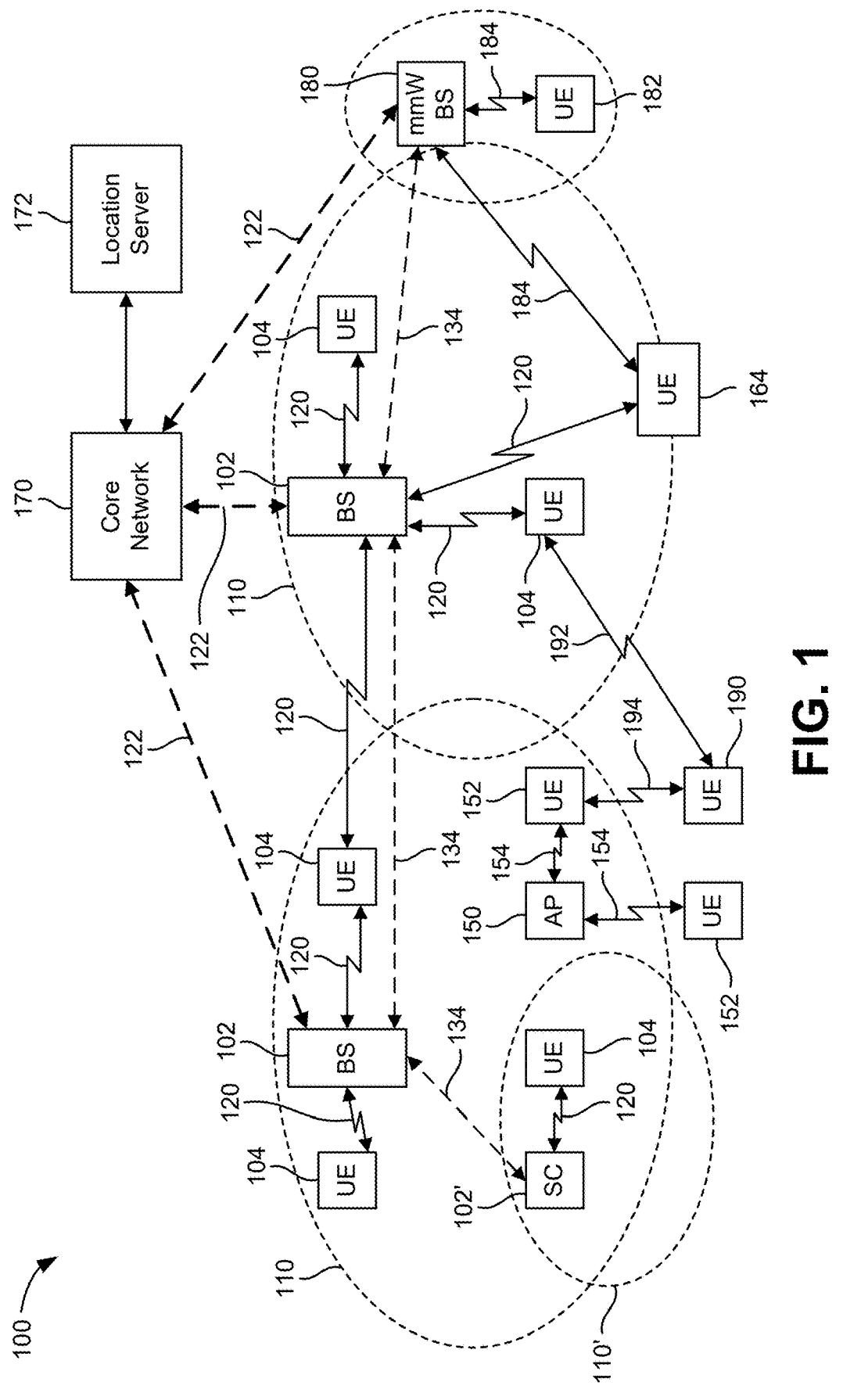
FIG. 1 is a block diagram illustrating an example of a wireless communication network, in accordance with some examples.

Certain aspects of this disclosure are provided below for illustration purposes. Alternate aspects may be devised without departing from the scope of the disclosure. Additionally, well-known elements of the disclosure will not be described in detail or will be omitted so as not to obscure the relevant details of the disclosure. Some of the aspects described herein may be applied independently and some of them may be applied in combination as would be apparent to those of skill in the art. In the following description, for the purposes of explanation, specific details are set forth in order to provide a thorough understanding of aspects of the application. However, it will be apparent that various aspects may be practiced without these specific details. The figures and description are not intended to be restrictive.

The ensuing description provides example aspects only, and is not intended to limit the scope, applicability, or configuration of the disclosure. Rather, the ensuing description of the example aspects will provide those skilled in the art with an enabling description for implementing an example aspect. It should be understood that various changes may be made in the function and arrangement of elements without departing from the scope of the application as set forth in the appended claims.

Wireless communication networks can be deployed to provide various communication services, such as voice, video, packet data, messaging, broadcast, any combination thereof, or other communication services. A wireless communication network may support both access links and sidelinks for communication between wireless devices. An access link may refer to any communication link between a client device (e.g., a user equipment (UE), a station (STA), or other client device) and a base station (e.g., a 3GPP gNB for 5G/NR, a 3GPP eNB for 4G/LTE, a Wi-Fi access point (AP), or other base station). For example, an access link may support uplink signaling, downlink signaling, connection procedures, etc. An example of an access link is a Uu link or interface (also referred to as an NR-Uu) between a 3GPP gNB and a UE.

In various communication protocols and/or wireless communication networks (e.g., 4G/LTE, 5G/NR, etc.), physical channels can correspond to sets of time-frequency resources used for transmissions such as transport channel data, control information, indicator information, etc. For example, each transport channel can be mapped to a physical channel of the network. The physical channels can correspond to the physical (PHY) layer, associated with the transmission and reception of data bits over a physical radio channel between a transmitter and a receiver. The PHY layer can include operations associated with modulation (and demodulation), coding (and decoding), and/or transmission (and reception), etc., of raw data bits over the physical radio channel.

PHY layer communications (e.g., communications performed using physical channels and/or the corresponding time-frequency resources of the physical channels) can utilize coherent transmission or non-coherent transmission. In coherent transmission, information may be encoded into the phase of RF signals transmitted over the physical radio channel. In non-coherent transmission, information is not encoded into the phase of the transmitted RF signals. For example, a coherent transmission may encode information into (e.g., using) a combination of the amplitude and phase of the transmitted RF signals, while a non-coherent transmission may encode information into only the amplitude or power of the transmitted RF signals.

Coherent transmission can be performed based on establishing phase coherence between the phase of the information-bearing RF signal and the phase of the physical channel used to carry the information-bearing RF signal. Based on the phase coherence, a UE or other receiver of a coherent transmission can perform decoding by canceling the channel phase from the receiver phase, to thereby obtain the true or information-bearing phase of one or more received symbols. For example, to decode a coherent transmission, a UE may first determine a channel estimate (e.g., perform channel estimation) to obtain channel state information (CSI) and/or other information corresponding to characteristics of the channel that can be used for tracking the carrier phase.

The channel estimate can be determined based on known reference signals transmitted by the gNB, base station, or other network entity that is also used to transmit the coherent transmission. For example, the UE can be configured to perform CSI acquisition based a demodulation reference signal (DMRS) or other pilot sequence and/or pilot transmission by the gNB. CSI acquisition can correspond to utilizing the DMRS or other pilot transmission to estimate the channel's effect on a signal (e.g., how the channel affects the signal's amplitude and phase). For example, the DMRS or other pilot transmission is implemented as a known reference signal, and the UE can determine the CSI by comparing the received DMRS signal with the known reference DMRS signal that was transmitted by the gNB (e.g., base station, network entity, etc.). The CSI estimate determined by the UE can be indicative of the channel phase and/or can be used to perform tracking of the carrier phase. Based on acquiring reliable (e.g., accurate) CSI and/or carrier phase tracking information for a channel, the UE can decode information symbols encoded into coherent transmissions received over the same channel.

Non-coherent transmission can be performed without phase coherence and/or without channel estimation by the receiver. For example, because non-coherent transmissions do not encode information into the phase, the UE can receive and decode a non-coherent transmission without the need to perform carrier phase tracking. In some cases, a UE can receive and decode a non-coherent transmission without any CSI acquisition (e.g., the UE can decode the non-coherent transmission without the UE first performing CSI acquisition or channel estimation).

In some examples, non-coherent transmission can be performed when a UE or other receiver is unable to acquire reliable CSI, such as in low signal-to-noise ratio (SNR) conditions. For example, high pathloss and/or wideband scenarios can correspond to low SNR conditions where the received energy per spectrum unit (e.g., Hertz (Hz)) is relatively low under a fixed transmit power, etc. In low SNR conditions, the UE may be unable to acquire reliable CSI, may be unable to acquire accurate CSI, and/or may be unable to perform CSI acquisition to acquire any CSI. In some aspects, "reliable" CSI may refer to CSI that is acquired with a precision and/or accuracy that is above a corresponding minimum or threshold required for coherent detection by the UE.

In some examples, non-coherent transmission can be performed to increase the time/frequency resource utilization on a physical channel. For example, as noted above, non-coherent transmission can be performed without CSI acquisition by the UE, and when the UE does not perform CSI acquisition, the gNB (e.g., base station, network entity, etc.) may skip transmission of the DMRS or other pilot sequence that would otherwise be used for the channel estimation. Skipping transmission of the DMRS or other pilot sequence can correspond to releasing the time-frequency resources that would otherwise have been reserved for the DMRS or pilot sequence. One or more additional data symbols can be transmitted between the gNB and the UE on these time-frequency resources that would otherwise have been reserved for the DMRS, and the time-frequency resource utilization associated with non-coherent transmission may be increased relative to the time-frequency resource utilization associated with coherent transmission.

Peaky transmission is a type of non-coherent transmission, and for example may be used when a UE or other receiver cannot acquire accurate or reliable CSI or other channel estimate information. Peaky transmission may also be used for UEs or other receivers that are not configured to perform (e.g., are not capable of performing) CSI acquisition or other channel estimation to perform the carrier phase tracking needed to decode coherent transmissions. As noted above, as a type of non-coherent transmission, peaky transmission can also be used to increase and/or improve the utilization of time-frequency resources on a channel based on skipping the transmission of a DMRS or other reference signal, pilot tone, pilot sequence, etc., by the transmitter associated with the peaky transmission.

In peaky transmission, energy is concentrated into a subset of the time resources within a configured transmission interval (e.g., such as a transmission time interval (TTI) or other time duration associated with the transmission of one or more symbols from a network entity to UE, etc.). For example, peaky transmission can correspond to transmitting during only a fraction of the total available transmission time. Within the configured transmission interval, the peaky transmission can be associated with an active time (e.g., with transmission of RF signals performed on a subset of the plurality of time-frequency resources included in the transmission interval) and an inactive or idle time (e.g., transmission of RF signals is not performed for the remaining subset of the plurality of time-frequency resources of the transmission interval).

The ratio between the active transmission time and the total available transmission time of the configured transmission interval can be referred to as the duty cycle of the peaky transmission, where the duty cycle has a value between 0 (e.g., no transmission is performed at any point within the configured interval) and 1 (e.g., continuous transmission at every time resource within the configured interval). For example, a peaky transmission with a duty cycle of 0.5 can be transmitted using 50% of the available time resources of the configured interval, with no transmission performed for the remaining 50% of the time resources of the configured interval. In another example, a peaky transmission with a duty cycle of 0.1 can be transmitted using 10% of the available time resources of the configured interval, with no transmission performed for the remaining 90% of the time resources of the configured interval, etc.

Based on transmitting during only a portion of the available time resources within a configured transmission interval, peaky transmission can be performed utilizing higher peak transmission powers. For example, the peaky transmission can be transmitted using a peak power (e.g., during the active transmission time of the configured interval) that is higher than the average power over the configured interval. For a duty cycle parameter $\theta$, the average transmission power of a peaky transmission during an active time (e.g., corresponding to $\theta$) of the configured time interval is $P_{avg} = ((P_{peak}*\text{active time}) + (P_{idle}*\text{idle time}))/(\text{active time} + \text{idle time})$.

As noted above, transmission does not occur during the idle time of a configured time interval where peaky transmission is performed, and $P_{idle}$ is equal to 0, and the average power $P_{avg}$ is less than the peak power $P_{peak}$ that is used for the peaky transmission.

In some examples, the peak transmit power used for a peaky transmission can be increased proportional to the inverse of the duty cycle (e.g., where the duty cycle is a fractional or percentage value between 0 and 1). As the duty cycle parameter $\theta$ decreases, the peak transmit power for the peaky transmission can be increased, based on the decreased duty cycle parameter $\theta$ corresponding to transmission during a shorter active time of the configured time interval available for transmission.

In some cases, peaky transmission and/or other non-coherent transmissions can be used in wideband scenarios where the transmission band is relatively wide (e.g., relatively large bandwidth, relatively high number of frequency resources across the width of the transmission band, etc.) and operates under a fixed and/or maximum power constraint. A wide transmission band with a fixed power constraint can correspond to a relatively low power per spectrum unit (e.g., power per Hz, etc.), which can make it difficult for a UE or other receiver to efficiently and/or accurately estimate the channel per spectrum unit (e.g., perform CSI acquisition). Increasing the width of a transmission band and/or decreasing the value of a fixed power constraint associated with transmissions within the transmission band reduces the power per spectrum unit, and a UE or other receiver may switch to non-coherent (e.g., peaky) transmission and/or reception based on a determination that reliable CSI acquisition has become infeasible or impossible (e.g., as peaky transmissions can be decoded without any CSI acquisition).

Peaky transmission can also be utilized in low SNR conditions, as the greater peak transmit power of the peaky transmission (e.g., relative to the average transmit power over the configured time interval within which the peaky transmission occurs) can increase the SNR of the reception by the UE. In some cases, peaky transmission may be utilized for low-powered network devices that are implemented with low maximum transmit power by design. For example, internet-of-things (IoT) devices and/or ambient IoT devices may be configured or implemented with very low maximum transmit powers that correspond to low SNR values even under ideal channel conditions. In some examples, IoT, ambient IoT, and/or other low-powered network devices can utilize non-coherent (e.g., peaky) transmission and reception for higher SNR.

In some examples, the duty cycle associated with peaky transmission corresponds to selecting and/or utilizing a subset of time resources of a plurality of time resources within a configured time interval. RF energy of the transmitted RF waveform(s) or RF signal(s) is concentrated in the time domain based on transmitting the peaky transmission during the subset of time resources (e.g., the active time of the configured time interval, also referred to as the duty cycle period).

Data or other information can be encoded in a peaky transmission based on selection of frequency resources (e.g., subcarriers) along the frequency axis of the grid of time-frequency resources for each duty cycle period. For example, the selection of a particular subcarrier from a plurality of subcarriers can be used to encode data or information based on transmitting the peaky transmission only on the set of time-frequency resources that are within the duty cycle active time and on the particular subcarrier. In some examples, peaky transmission can be performed based on using index modulation to encode and/or represent different symbols (e.g., also referred to as "peaky symbols"). For example, each subcarrier index of a plurality of subcarrier indices corresponding to the different frequency resources available within the time-frequency resource grid can be used to indicate, via the peaky transmission, a distinct data symbol to transmit. To decode the peaky transmission, the UE or other receiver is configured to determine which subcarrier index is carrying the RF energy of the peaky reception within each duty cycle period or other configured time interval.

Peaky transmission of data or other information may correspond to scheduling multiple peaky symbols in time, where consecutive peaky symbols are separated by a transmission gap based on the duty cycle parameter θ. Longer messages may be represented by larger quantities of peaky symbols. For example, a single data message (e.g., data transmission) may correspond to a plurality of peaky symbols that are scheduled in time, with each peaky symbol of the plurality corresponding to the same, single message. The plurality of peaky symbols for a single message may be scheduled in time across one or multiple slots, sub-frames, frames, half-frames, etc., which may correspond to an increased probability of one or more data transmission errors occurring. Existing techniques for peaky transmission do not support the use of redundancy information and/or redundancy bits that may be combined with the data bits encoded on a plurality of peaky symbols that are scheduled to transmit the same (e.g., single) message. There is a need for systems and techniques that can be used to configure and/or manage redundancy information (e.g., redundancy bits) for peaky or other non-coherent transmissions between network devices. For example, there is a need for systems and techniques that can be used to provide redundancy bits for a plurality of peaky symbols that are scheduled to transmit the same message.

Systems, apparatuses, processes (also referred to as methods), and computer-readable media (collectively referred to as "systems and techniques") are described herein that can be used to provide redundancy configuration and/or management for non-coherent (e.g., peaky) transmissions between network devices. For example, the systems and techniques can be used to provide redundancy bit configurations for encoding a plurality of data bits and a plurality of corresponding redundancy bits onto a set of peaky symbols scheduled in time for non-coherent transmission between network devices. In some cases, the redundancy bits can include cyclic redundancy check (CRC) bits, forward error correction (FEC) bits, and/or various combinations of CRC and FEC bits.

Configuration information can be signaled between a transmitter network device (e.g., base station, gNB, network entity, etc.) and a receiver network device (e.g., UE, IoT device, ambient IoT device, etc.). The configuration information can be configuration information for redundancy bits associated with scheduled non-coherent (e.g., peaky) transmissions. For example, the configuration information can be indicative of a correspondence or mapping between the plurality of redundancy bits determined for a message and the plurality of transmissions (e.g., symbols) scheduled to transmit the message.

In one illustrative example, the configuration information can be indicative of per-transmission attachment of redundancy bits. For example, each non-coherent transmission of a plurality of non-coherent transmissions scheduled for the same message can represent at least one symbol (e.g., at least one peaky symbol). Each symbol can encode a corresponding subset of the plurality of data bits of the message, and a corresponding subset of the plurality of redundancy bits. For example, the redundancy bits associated with each symbol or transmission scheduled for the message can be CRC, FEC, and/or a combination of CRC and FEC bits that are calculated based on the subset of data bits encoded for the particular symbol or transmission.

In one illustrative example, the configuration information can be indicative of per-message attachment of redundancy bits. For example, the plurality of redundancy bits (e.g., CRC, FEC, and/or combinations of CRC and FEC bits) can be determined for the plurality of data bits of the message. The plurality of data bits and corresponding plurality of redundancy bits calculated for the message can be interleaved onto a plurality of peaky symbols that are scheduled in time for non-coherent (e.g., peaky) transmission of the message and the redundancy information from the transmitter (e.g., network entity, base station, gNB, etc.) to the receiver (e.g., UE, etc.). Each peaky symbol can comprise or correspond to a non-coherent transmission of the plurality of non-coherent transmissions corresponding to and scheduled for the single message. Each non-coherent transmission can be transmitted based on a duty cycle or duty cycle parameter corresponding to the scheduled non-coherent transmissions from the transmitter device.

The UE (e.g., receiver device) can receive the redundancy bit configuration information based on signaling from the same transmitter device (e.g., base station, gNB, network entity, etc.) that schedules the plurality of non-coherent transmissions for the set of peaky symbols corresponding to the message. The redundancy bit configuration information can be indicative of a selection between a per-symbol (e.g., per-transmission) attachment of redundancy bits, and a per-message attachment of redundancy bits. Based on the redundancy bit configuration signaled by the configuration information, the UE can perform corresponding decoding of the peaky symbols and transmissions to decode (e.g., determine) error control information based on the redundancy bits encoded in the peaky symbols.

In some aspects, the redundancy bit configuration can be determined based on dynamic signaling received by the UE. For example, the redundancy bit configuration can be dynamically indicated as a selection between per-symbol and per-message attachment of redundancy bits via Layer 1 (L1) signaling received by the UE. In some examples, the redundancy bit configuration can be determined based on semi-static signaling received by the UE. For example, the redundancy bit configuration can be semi-statically indicated as a selection between per-symbol and per-message attachment of redundancy bits via one or more radio resource control (RRC) messages received by the UE.

In some cases, the redundancy bits corresponding to the plurality of data bits of a message can include at least CRC bits. In some examples, the redundancy bits can include CRC bits and FEC bits. The same configuration information used for CRC attachment to either individual peaky symbols or the single message corresponding to the plurality of peaky symbols can also be used for the attachment of the FEC bits (e.g., CRC attachment and FEC attachment can be configured to both utilize per-symbol attachment, or to both utilize per-message attachment).

Further aspects of the systems and techniques will be described with respect to the figures.

As used herein, the phrase "based on" shall not be construed as a reference to a closed set of information, one or more conditions, one or more factors, or the like. In other words, the phrase "based on A" (where "A" may be information, a condition, a factor, or the like) shall be construed as "based at least on A" unless specifically recited differently.

As used herein, the terms "user equipment" (UE) and "network entity" are not intended to be specific or otherwise limited to any particular radio access technology (RAT), unless otherwise noted. In general, a UE may be any wireless communication device (e.g., a mobile phone, router, tablet computer, laptop computer, and/or tracking device, etc.), wearable (e.g., smartwatch, smart-glasses, wearable ring, and/or an extended reality (XR) device such as a virtual reality (VR) headset, an augmented reality (AR) headset or glasses, or a mixed reality (MR) headset), vehicle (e.g., automobile, motorcycle, bicycle, etc.), aircraft (e.g., an airplane, jet, unmanned aerial vehicle (UAV) or drone, helicopter, airship, glider, etc.), and/or Internet of Things (IoT) device, etc., used by a user to communicate over a wireless communications network. A UE may be mobile or may (e.g., at certain times) be stationary, and may communicate with a radio access network (RAN). As used herein, the term "UE" may be referred to interchangeably as an "access terminal" or "AT," a "client device," a "wireless device," a "subscriber device," a "subscriber terminal," a "subscriber station," a "user terminal" or "UT," a "mobile device," a "mobile terminal," a "mobile station," or variations thereof. Generally, UEs can communicate with a core network via a RAN, and through the core network the UEs can be connected with external networks such as the Internet and with other UEs. Of course, other mechanisms of connecting to the core network and/or the Internet are also possible for the UEs, such as over wired access networks, wireless local area network (WLAN) networks (e.g., based on IEEE 802.11 communication standards, etc.), and so on.

A network entity can be implemented in an aggregated or monolithic base station architecture, or alternatively, in a disaggregated base station architecture, and may include one or more of a central unit (CU), a distributed unit (DU), a radio unit (RU), a Near-Real Time (Near-RT) RAN Intelligent Controller (RIC), or a Non-Real Time (Non-RT) RIC. A base station (e.g., with an aggregated/monolithic base station architecture or disaggregated base station architecture) may operate according to one of several RATs in communication with UEs depending on the network in which it is deployed, and may be alternatively referred to as an access point (AP), a network node, a NodeB (NB), an evolved NodeB (eNB), a next generation eNB (ng-eNB), a New Radio (NR) Node B (also referred to as a gNB or gNodeB), etc. A base station may be used primarily to support wireless access by UEs, including supporting data, voice, and/or signaling connections for the supported UEs. In some systems, a base station may provide edge node signaling functions while in other systems it may provide additional control and/or network management functions. A communication link through which UEs can send signals to a base station is called an uplink (UL) channel (e.g., a reverse traffic channel, a reverse control channel, an access channel, etc.). A communication link through which the base station can send signals to UEs is called a downlink (DL) or forward link channel (e.g., a paging channel, a control channel, a broadcast channel, or a forward traffic channel, etc.). The term traffic channel (TCH), as used herein, can refer to either an uplink, reverse or downlink, and/or a forward traffic channel.

The term "network entity" or "base station" (e.g., with an aggregated/monolithic base station architecture or disaggregated base station architecture) may refer to a single physical transmit receive point (TRP) or to multiple physical TRPs that may or may not be co-located. For example, where the term "network entity" or "base station" refers to a single physical TRP, the physical TRP may be an antenna of the base station corresponding to a cell (or several cell sectors) of the base station. Where the term "network entity" or "base station" refers to multiple co-located physical TRPs, the physical TRPs may be an array of antennas (e.g., as in a multiple-input multiple-output (MIMO) system or where the base station employs beamforming) of the base station. Where the term "base station" refers to multiple non-co-located physical TRPs, the physical TRPs may be a distributed antenna system (DAS) (e.g., a network of spatially separated antennas connected to a common source via a transport medium) or a remote radio head (RRH) (e.g., a remote base station connected to a serving base station). Alternatively, the non-co-located physical TRPs may be the serving base station receiving the measurement report from the UE and a neighbor base station whose reference radio frequency (RF) signals (e.g., or simply "reference signals") the UE is measuring. Because a TRP is the point from which a base station transmits and receives wireless signals, as used herein, references to transmission from or reception at a base station are to be understood as referring to a particular TRP of the base station.

In some implementations that support positioning of UEs, a network entity or base station may not support wireless access by UEs (e.g., may not support data, voice, and/or signaling connections for UEs), but may instead transmit reference signals to UEs to be measured by the UEs, and/or may receive and measure signals transmitted by the UEs. Such a base station may be referred to as a positioning beacon (e.g., when transmitting signals to UEs) and/or as a location measurement unit (e.g., when receiving and measuring signals from UEs).

As described herein, a node (which may be referred to as a node, a network node, a network entity, or a wireless node) may include, be, or be included in (e.g., be a component of) a base station (e.g., any base station described herein), a UE (e.g., any UE described herein), a network controller, an apparatus, a device, a computing system, an integrated access and backhauling (IAB) node, a distributed unit (DU), a central unit (CU), a remote/radio unit (RU) (which may also be referred to as a remote radio unit (RRU)), and/or another processing entity configured to perform any of the techniques described herein. For example, a network node may be a UE. As another example, a network node may be a base station or network entity. As another example, a first network node may be configured to communicate with a second network node or a third network node. In one aspect of this example, the first network node may be a UE, the second network node may be a base station, and the third network node may be a UE. In another aspect of this example, the first network node may be a UE, the second network node may be a base station, and the third network node may be a base station. In yet other aspects of this example, the first, second, and third network nodes may be different relative to these examples. Similarly, reference to a UE, base station, apparatus, device, computing system, or the like may include disclosure of the UE, base station, apparatus, device, computing system, or the like being a network node. For example, disclosure that a UE is configured to receive information from a base station also discloses that a first network node is configured to receive information from a second network node. Consistent with this disclosure, once a specific example is broadened in accordance with this disclosure (e.g., a UE is configured to receive information from a base station also discloses that a first network node is configured to receive information from a second network node), the broader example of the narrower example may be interpreted in the reverse, but in a broad open-ended way. In the example above where a UE is configured to receive information from a base station also discloses that a first network node is configured to receive information from a second network node, the first network node may refer to a first UE, a first base station, a first apparatus, a first device, a first computing system, a first set of one or more one or more components, a first processing entity, or the like configured to receive the information; and the second network node may refer to a second UE, a second base station, a second apparatus, a second device, a second computing system, a second set of one or more components, a second processing entity, or the like.

As described herein, communication of information (e.g., any information, signal, or the like) may be described in various aspects using different terminology. Disclosure of one communication term includes disclosure of other communication terms. For example, a first network node may be described as being configured to transmit information to a second network node. In this example and consistent with this disclosure, disclosure that the first network node is configured to transmit information to the second network node includes disclosure that the first network node is configured to provide, send, output, communicate, or transmit information to the second network node. Similarly, in this example and consistent with this disclosure, disclosure that the first network node is configured to transmit information to the second network node includes disclosure that the second network node is configured to receive, obtain, or decode the information that is provided, sent, output, communicated, or transmitted by the first network node.

An RF signal comprises an electromagnetic wave of a given frequency that transports information through the space between a transmitter and a receiver. As used herein, a transmitter may transmit a single "RF signal" or multiple "RF signals" to a receiver. However, the receiver may receive multiple "RF signals" corresponding to each transmitted RF signal due to the propagation characteristics of RF signals through multipath channels. The same transmitted RF signal on different paths between the transmitter and receiver may be referred to as a "multipath" RF signal. As used herein, an RF signal may also be referred to as a "wireless signal" or simply a "signal" where it is clear from the context that the term "signal" refers to a wireless signal or an RF signal.

Various aspects of the systems and techniques described herein will be discussed below with respect to the figures. According to various aspects, FIG. 1 illustrates an example of a wireless communications system 100. The wireless communications system 100 (e.g., which may also be referred to as a wireless wide area network (WWAN)) can include various base stations 102 and various UEs 104. In some aspects, the base stations 102 may also be referred to as "network entities" or "network nodes." One or more of the base stations 102 can be implemented in an aggregated or monolithic base station architecture. Additionally, or alternatively, one or more of the base stations 102 can be implemented in a disaggregated base station architecture, and may include one or more of a central unit (CU), a distributed unit (DU), a radio unit (RU), a Near-Real Time (Near-RT) RAN Intelligent Controller (RIC), or a Non-Real Time (Non-RT) RIC. The base stations 102 can include macro cell base stations (e.g., high power cellular base stations) and/or small cell base stations (e.g., low power cellular base stations). In an aspect, the macro cell base station may include eNBs and/or ng-eNBs where the wireless communications system 100 corresponds to a long-term evolution (LTE) network, or gNBs where the wireless communications system 100 corresponds to a NR network, or a combination of both, and the small cell base stations may include femtocells, picocells, microcells, etc.

The base stations 102 may collectively form a RAN and interface with a core network 170 (e.g., an evolved packet core (EPC) or a 5G core (5GC)) through backhaul links 122, and through the core network 170 to one or more location servers 172 (e.g., which may be part of core network 170 or may be external to core network 170). In addition to other functions, the base stations 102 may perform functions that relate to one or more of transferring user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, RAN sharing, multimedia broadcast multicast service (MBMS), subscriber and equipment trace, RAN information management (RIM), paging, positioning, and delivery of warning messages. The base stations 102 may communicate with each other directly or indirectly (e.g., through the EPC or 5GC) over backhaul links 134, which may be wired and/or wireless.

The base stations 102 may wirelessly communicate with the UEs 104. Each of the base stations 102 may provide communication coverage for a respective geographic coverage area 110. In an aspect, one or more cells may be supported by a base station 102 in each coverage area 110.

A "cell" is a logical communication entity used for communication with a base station (e.g., over some frequency resource, referred to as a carrier frequency, component carrier, carrier, band, or the like), and may be associated with an identifier (e.g., a physical cell identifier (PCI), a virtual cell identifier (VCI), a cell global identifier (CGI)) for distinguishing cells operating via the same or a different carrier frequency. In some cases, different cells may be configured according to different protocol types (e.g., machine-type communication (MTC), narrowband IoT (NB-IoT), enhanced mobile broadband (eMBB), or others) that may provide access for different types of UEs. Because a cell is supported by a specific base station, the term "cell" may refer to either or both of the logical communication entity and the base station that supports it, depending on the context. In addition, because a TRP is typically the physical transmission point of a cell, the terms "cell" and "TRP" may be used interchangeably. In some cases, the term "cell" may also refer to a geographic coverage area of a base station (e.g., a sector), insofar as a carrier frequency can be detected and used for communication within some portion of geographic coverage areas 110.

While neighboring macro cell base station 102 geographic coverage areas 110 may partially overlap (e.g., in a handover region), some of the geographic coverage areas 110 may be substantially overlapped by a larger geographic coverage area 110. For example, a small cell base station 102' may have a coverage area 110' that substantially overlaps with the coverage area 110 of one or more macro cell base stations 102. A network that includes both small cell and macro cell base stations may be known as a heterogeneous network. A heterogeneous network may also include home eNBs (HeNBs), which may provide service to a restricted group known as a closed subscriber group (CSG).

The communication links 120 between the base stations 102 and the UEs 104 may include uplink (e.g., also referred to as reverse link) transmissions from a UE 104 to a base station 102 and/or downlink (e.g., also referred to as forward link) transmissions from a base station 102 to a UE 104. The communication links 120 may use MIMO antenna technology, including spatial multiplexing, beamforming, and/or transmit diversity. The communication links 120 may be provided using one or more carrier frequencies. Allocation of carriers may be asymmetric with respect to downlink and uplink (e.g., a greater or lesser quantity of carriers may be allocated for downlink than for uplink).

Beamforming, which may also be referred to as spatial filtering, directional transmission, or directional reception, is a signal processing technique that may be used at a transmitting device or a receiving device (e.g., one or more of the base stations 102, UEs 104, etc.) to shape or steer an antenna beam (e.g., a transmit beam, a receive beam) along a spatial path between the transmitting device and the receiving device. Beamforming may be implemented based on combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

A transmitting device and/or a receiving device (e.g., such as one or more of base stations 102 and/or UEs 104) may use beam sweeping techniques as part of beam forming operations. For example, a base station 102 (e.g., or other transmitting device) may use multiple antennas or antenna arrays (e.g., antenna panels) to conduct beamforming operations for directional communications with a UE 104 (e.g., or other receiving device). Some signals (e.g., synchronization signals, reference signals, beam selection signals, or other control signals) may be transmitted by base station 102 (or other transmitting device) multiple times in different directions. For example, the base station 102 may transmit a signal according to different beamforming weight sets associated with different directions of transmission. Transmissions in different beam directions may be used to identify (e.g., by a transmitting device, such as a base station 102, or by a receiving device, such as a UE 104) a beam direction for later transmission or reception by the base station 102.

Some signals, such as data signals associated with a particular receiving device, may be transmitted by a base station 102 in a single beam direction (e.g., a direction associated with the receiving device, such as a UE 104). In some examples, the beam direction associated with transmissions along a single beam direction may be determined based on a signal that was transmitted in one or more beam directions. For example, a UE 104 may receive one or more of the signals transmitted by the base station 102 in different directions and may report to the base station 104 an indication of the signal that the UE 104 received with a highest signal quality or an otherwise acceptable signal quality.

In some examples, transmissions by a device (e.g., by a base station 102 or a UE 104) may be performed using multiple beam directions, and the device may use a combination of digital precoding or radio frequency beamforming to generate a combined beam for transmission (e.g., from a base station 102 to a UE 104, from a transmitting device to a receiving device, etc.). The UE 104 may report feedback that indicates precoding weights for one or more beam directions, and the feedback may correspond to a configured number of beams across a system bandwidth or one or more sub-bands. The base station 102 may transmit a reference signal (e.g., a cell-specific reference signal (CRS), a channel state information reference signal (CSI-RS), etc.), which may be precoded or unprecoded. The UE 104 may provide feedback for beam selection, which may be a precoding matrix indicator (PMI) or codebook-based feedback (e.g., a multi-panel type codebook, a linear combination type codebook, a port selection type codebook). Although these techniques are described with reference to signals transmitted in one or more directions by a base station 102, a UE 104 may employ similar techniques for transmitting signals multiple times in different directions (e.g., for identifying a beam direction for subsequent transmission or reception by the UE 104) or for transmitting a signal in a single direction (e.g., for transmitting data to a receiving device).

A receiving device (e.g., a UE 104) may try multiple receive configurations (e.g., directional listening) when receiving various signals from the base station 102, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets (e.g., different directional listening weight sets) applied to signals received at multiple antenna elements of an antenna array, or by processing received signals according to different receive beamforming weight sets applied to signals received at multiple antenna elements of an antenna array, any of which may be referred to as "listening" according to different receive configurations or receive directions. In some examples, a receiving device may use a single receive configuration to receive along a single beam direction (e.g., when receiving a data signal). The single receive configuration may be aligned in a beam direction determined based on listening according to different receive configuration directions (e.g., a beam direction determined to have a highest signal strength, highest signal-to-noise ratio (SNR), or otherwise acceptable signal quality based on listening according to multiple beam directions).

The wireless communications system 100 may further include a WLAN AP 150 in communication with WLAN stations (STAs) 152 via communication links 154 in an unlicensed frequency spectrum (e.g., 5 Gigahertz (GHz)). When communicating in an unlicensed frequency spectrum, the WLAN STAs 152 and/or the WLAN AP 150 may perform a clear channel assessment (CCA) or listen before talk (LBT) procedure prior to communicating in order to determine whether the channel is available. In some examples, the wireless communications system 100 can include devices (e.g., UEs, etc.) that communicate with one or more UEs 104, base stations 102, APs 150, etc., utilizing the ultra-wideband (UWB) spectrum. The UWB spectrum can range from 3.1 to 10.5 GHz.

The small cell base station 102' may operate in a licensed and/or an unlicensed frequency spectrum. When operating in an unlicensed frequency spectrum, the small cell base station 102' may employ LTE or NR technology and use the same 5 GHz unlicensed frequency spectrum as used by the WLAN AP 150. The small cell base station 102', employing LTE and/or 5G in an unlicensed frequency spectrum, may boost coverage to and/or increase capacity of the access network. NR in unlicensed spectrum may be referred to as NR-U. LTE in an unlicensed spectrum may be referred to as LTE-U, licensed assisted access (LAA), or MulteFire.

The wireless communications system 100 may further include a millimeter wave (mmW) base station 180 that may operate in mmW frequencies and/or near mmW frequencies in communication with a UE 182. The mmW base station 180 may be implemented in an aggregated or monolithic base station architecture, or alternatively, in a disaggregated base station architecture (e.g., including one or more of a CU, a DU, a RU, a Near-RT RIC, or a Non-RT RIC). Extremely high frequency (EHF) is part of the RF in the electromagnetic spectrum. EHF has a range of 30 GHz to 300 GHz and a wavelength between 1 millimeter and 10 millimeters. Radio waves in this band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW and/or near mmW radio frequency band have high path loss and a relatively short range. The mmW base station 180 and the UE 182 may utilize beamforming (e.g., transmit and/or receive) over an mmW communication link 184 to compensate for the extremely high path loss and short range. Further, it will be appreciated that in alternative configurations, one or more base stations 102 may also transmit using mmW or near mmW and beamforming. Accordingly, it will be appreciated that the foregoing illustrations are merely examples and should not be construed to limit the various aspects disclosed herein.

In some aspects relating to 5G, the frequency spectrum in which wireless network nodes or entities (e.g., base stations 102/180, UEs 104/182) operate is divided into multiple frequency ranges, FR1 (e.g., from 450 to 6,000 Megahertz (MHz)), FR2 (e.g., from 24,250 to 52,600 MHZ), FR3 (e.g., above 52,600 MHz), and FR4 (e.g., between FR1 and FR2). In a multi-carrier system, such as 5G, one of the carrier frequencies is referred to as the "primary carrier" or "anchor carrier" or "primary serving cell" or "PCell," and the remaining carrier frequencies are referred to as "secondary carriers" or "secondary serving cells" or "SCells." In carrier aggregation, the anchor carrier is the carrier operating on the primary frequency (e.g., FR1) utilized by a UE 104/182 and the cell in which the UE 104/182 either performs the initial radio resource control (RRC) connection establishment procedure or initiates the RRC connection re-establishment procedure. The primary carrier carries all common and UE-specific control channels and may be a carrier in a licensed frequency (however, this is not always the case). A secondary carrier is a carrier operating on a second frequency (e.g., FR2) that may be configured once the RRC connection is established between the UE 104 and the anchor carrier and that may be used to provide additional radio resources. In some cases, the secondary carrier may be a carrier in an unlicensed frequency. The secondary carrier may contain only necessary signaling information and signals, for example, those that are UE-specific may not be present in the secondary carrier, since both primary uplink and downlink carriers are typically UE-specific. This means that different UEs 104/182 in a cell may have different downlink primary carriers. The same is true for the uplink primary carriers. The network is able to change the primary carrier of any UE 104/182 at any time. This is done, for example, to balance the load on different carriers. Because a "serving cell" (e.g., whether a PCell or an SCell) corresponds to a carrier frequency and/or component carrier over which some base station is communicating, the term "cell," "serving cell," "component carrier," "carrier frequency," and the like can be used interchangeably.

For example, still referring to FIG. 1, one of the frequencies utilized by the macro cell base stations 102 may be an anchor carrier (or "PCell") and other frequencies utilized by the macro cell base stations 102 and/or the mmW base station 180 may be secondary carriers ("SCells"). In carrier aggregation, the base stations 102 and/or the UEs 104 may use spectrum up to Y MHz (e.g., 5, 10, 15, 20, 100 MHz) bandwidth per carrier up to a total of Yx MHz (e.g., x component carriers) for transmission in each direction. The component carriers may or may not be adjacent to each other on the frequency spectrum. Allocation of carriers may be asymmetric with respect to the downlink and uplink (e.g., a greater or lesser quantity of carriers may be allocated for downlink than for uplink). The simultaneous transmission and/or reception of multiple carriers enables the UE 104/182 to significantly increase its data transmission and/or reception rates. For example, two 20 MHz aggregated carriers in a multi-carrier system would theoretically lead to a two-fold increase in data rate (e.g., 40 MHz), compared to that attained by a single 20 MHz carrier.

In order to operate on multiple carrier frequencies, a base station 102 and/or a UE 104 can be equipped with multiple receivers and/or transmitters. For example, a UE 104 may have two receivers, "Receiver 1" and "Receiver 2," where "Receiver 1" is a multi-band receiver that can be tuned to band (e.g., carrier frequency) 'X' or band 'Y,' and "Receiver 2" is a one-band receiver tunable to band 'Z' only. In this example, if the UE 104 is being served in band 'X,' band 'X' would be referred to as the PCell or the active carrier frequency, and "Receiver 1" would need to tune from band 'X' to band 'Y' (e.g., an SCell) in order to measure band 'Y' (and vice versa). In contrast, whether the UE 104 is being served in band 'X' or band 'Y,' because of the separate "Receiver 2," the UE 104 can measure band 'Z' without interrupting the service on band 'X' or band 'Y.'

The wireless communications system 100 may further include a UE 164 that may communicate with a macro cell base station 102 over a communication link 120 and/or the mmW base station 180 over an mmW communication link 184. For example, the macro cell base station 102 may support a PCell and one or more SCells for the UE 164 and the mmW base station 180 may support one or more SCells for the UE 164.

The wireless communications system 100 may further include one or more UEs, such as UE 190, that connects indirectly to one or more communication networks via one or more device-to-device (D2D) peer-to-peer (P2P) links (e.g., referred to as "sidelinks"). In the example of FIG. 1, UE 190 has a D2D P2P link 192 with one of the UEs 104 connected to one of the base stations 102 (e.g., through which UE 190 may indirectly obtain cellular connectivity) and a D2D P2P link 194 with WLAN STA 152 connected to the WLAN AP 150 (e.g., through which UE 190 may indirectly obtain WLAN-based Internet connectivity). In an example, the D2D P2P links 192 and 194 may be supported with any well-known D2D RAT, such as LTE Direct (LTE-D), Wi-Fi Direct (Wi-Fi-D), Bluetooth®, and so on.

Figure 2:
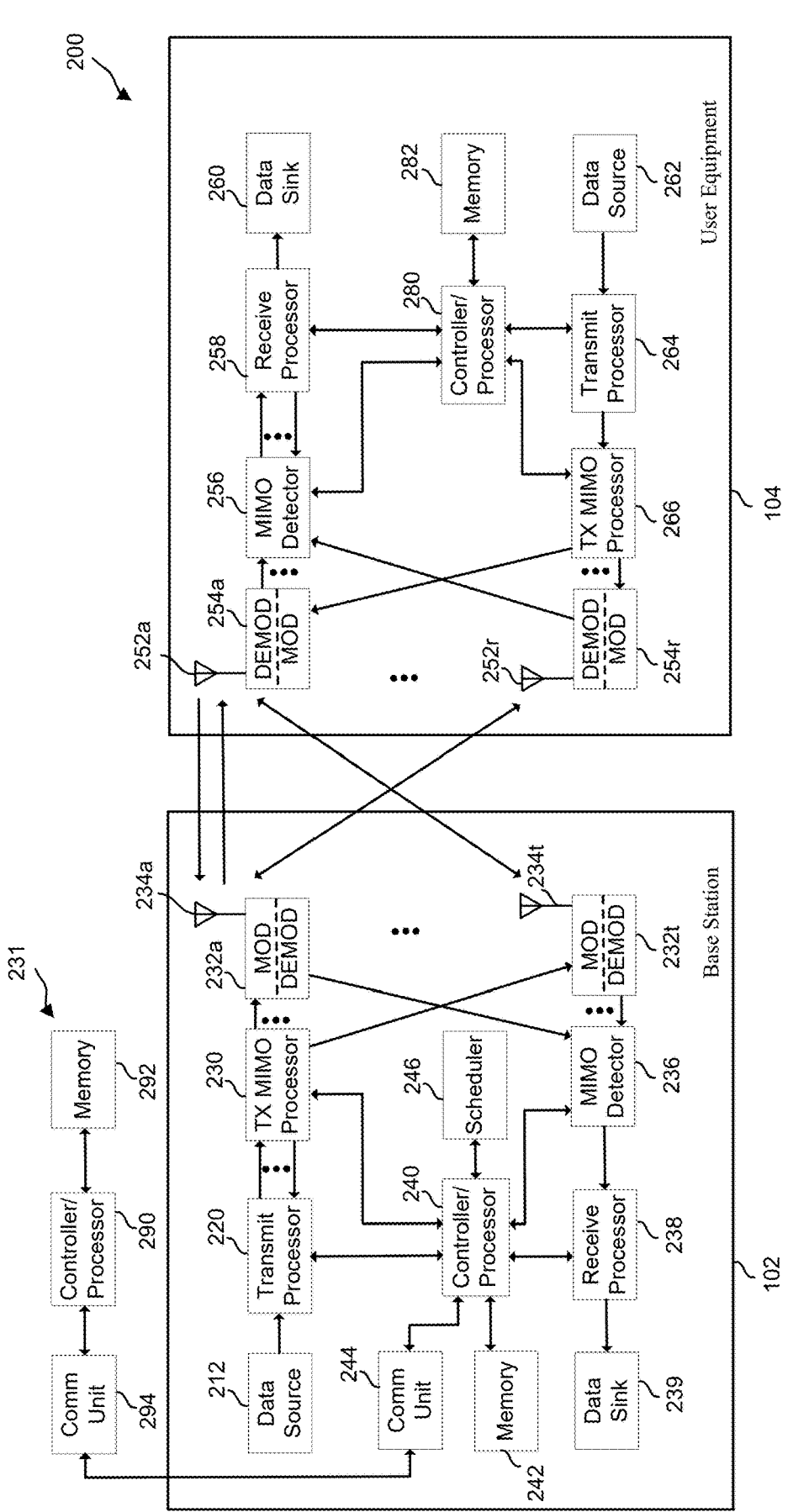
FIG. 2 is a diagram illustrating a design of a base station and a User Equipment (UE) device that enable transmission and processing of signals exchanged between the UE and the base station, in accordance with some examples.

FIG. 2 illustrates a block diagram of an example architecture 200 of a base station 102 and a UE 104 that enables transmission and processing of signals exchanged between the UE and the base station, in accordance with some aspects of the present disclosure. Example architecture 200 includes components of a base station 102 and a UE 104, which may be one of the base stations 102 and one of the UEs 104 illustrated in FIG. 1. Base station 102 may be equipped with T antennas 234a through 234t, and UE 104 may be equipped with R antennas 252a through 252r, where in general T≥1 and R≥1.

At base station 102, a transmit processor 220 may receive data from a data source 212 for one or more UEs, select one or more modulation and coding schemes (MCS) for each UE based on channel quality indicators (CQIs) received from the UE, process (e.g., encode and modulate) the data for each UE based on the MCS(s) selected for the UE, and provide data symbols for all UEs. Transmit processor 220 may also process system information (e.g., for semi-static resource partitioning information (SRPI) and/or the like) and control information (e.g., CQI requests, grants, upper layer signaling, and/or the like) and provide overhead symbols and control symbols. Transmit processor 220 may also generate reference symbols for reference signals (e.g., the cell-specific reference signal (CRS)) and synchronization signals (e.g., the primary synchronization signal (PSS) and secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. The modulators 232a through 232t are shown as a combined modulator-demodulator (MOD-DEMOD). In some cases, the modulators and demodulators can be separate components. Each modulator of the modulators 232a to 232t may process a respective output symbol stream (e.g., for an orthogonal frequency-division multiplexing (OFDM) scheme and/or the like) to obtain an output sample stream. Each modulator of the modulators 232a to 232t may further process (e.g., convert to analog, amplify, filter, and upconvert) the output sample stream to obtain a downlink signal. T downlink signals may be transmitted from modulators 232a to 232t via T antennas 234a through 234t, respectively. According to certain aspects described in more detail below, the synchronization signals can be generated with location encoding to convey additional information.

At UE 104, antennas 252a through 252r may receive the downlink signals from base station 102 and/or other base stations and may provide received signals to one or more demodulators (DEMODs) 254a through 254r, respectively. The demodulators 254a through 254r are shown as a combined modulator-demodulator (MOD-DEMOD). In some cases, the modulators and demodulators can be separate components. Each demodulator of the demodulators 254a through 254r may condition (e.g., filter, amplify, downconvert, and digitize) a received signal to obtain input samples. Each demodulator of the demodulators 254a through 254r may further process the input samples (e.g., for OFDM and/or the like) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 104 to a data sink 260, and provide decoded control information and system information to a controller/processor 280. A channel processor may determine reference signal received power (RSRP), received signal strength indicator (RSSI), reference signal received quality (RSRQ), channel quality indicator (CQI), and/or the like.

On the uplink, at UE 104, a transmit processor 264 may receive and process data from a data source 262 and control information (e.g., for reports comprising RSRP, RSSI, RSRQ, CQI, and/or the like) from controller/processor 280. Transmit processor 264 may also generate reference symbols for one or more reference signals (e.g., based on a beta value or a set of beta values associated with the one or more reference signals). The symbols from transmit processor 264 may be precoded by a TX-MIMO processor 266, further processed by modulators 254a through 254r (e.g., for DFT-s-OFDM, CP-OFDM, and/or the like), and transmitted to base station 102. At base station 102, the uplink signals from UE 104 and other UEs may be received by antennas 234a through 234t, processed by demodulators 232a through 232t, detected by a MIMO detector 236 (e.g., if applicable), and further processed by a receive processor 238 to obtain decoded data and control information sent by UE 104. Receive processor 238 may provide the decoded data to a data sink 239 and the decoded control information to controller (e.g., processor) 240. Base station 102 may include communication unit 244 and communicate to a network controller 231 via communication unit 244. Network controller 231 may include communication unit 294, controller/processor 290, and memory 292.

In some aspects, one or more components of UE 104 may be included in a housing. Controller 240 of base station 102, controller/processor 280 of UE 104, and/or any other component(s) of FIG. 2 may perform one or more techniques associated with implicit UCI beta value determination for NR.

Memories 242 and 282 may store data and program codes for the base station 102 and the UE 104, respectively. A scheduler 246 may schedule UEs for data transmission on the downlink, uplink, and/or sidelink.

In some aspects, deployment of communication systems, such as 5G new radio (NR) systems, may be arranged in multiple manners with various components or constituent parts. In a 5G NR system, or network, a network node, a network entity, a mobility element of a network, a radio access network (RAN) node, a core network node, a network element, or a network equipment, such as a base station (BS), or one or more units (or one or more components) performing base station functionality, may be implemented in an aggregated or disaggregated architecture. For example, a BS (e.g., such as a Node B (NB), evolved NB (eNB), NR BS, 5G NB, access point (AP), a transmit receive point (TRP), or a cell, etc.) may be implemented as an aggregated base station (e.g., also known as a standalone BS or a monolithic BS) or a disaggregated base station.

An aggregated base station may be configured to utilize a radio protocol stack that is physically or logically integrated within a single RAN node. A disaggregated base station may be configured to utilize a protocol stack that is physically or logically distributed among two or more units (e.g., such as one or more central or centralized units (CUs), one or more distributed units (DUs), or one or more radio units (RUS)). In some aspects, a CU may be implemented within a RAN node, and one or more DUs may be co-located with the CU, or alternatively, may be geographically or virtually distributed throughout one or multiple other RAN nodes. The DUs may be implemented to communicate with one or more RUs. Each of the CU, DU and RU also can be implemented as virtual units, e.g., a virtual central unit (VCU), a virtual distributed unit (VDU), or a virtual radio unit (VRU).

Base station-type operation or network design may consider aggregation characteristics of base station functionality. For example, disaggregated base stations may be utilized in an integrated access backhaul (IAB) network, an open radio access network (O-RAN (e.g., such as the network configuration sponsored by the O-RAN Alliance)), or a virtualized radio access network (e.g., vRAN, also known as a cloud radio access network (C-RAN)). Disaggregation may include distributing functionality across two or more units at various physical locations, as well as distributing functionality for at least one unit virtually, which can enable flexibility in network design. The various units of the disaggregated base station, or disaggregated RAN architecture, can be configured for wired or wireless communication with at least one other unit.

Figure 3:
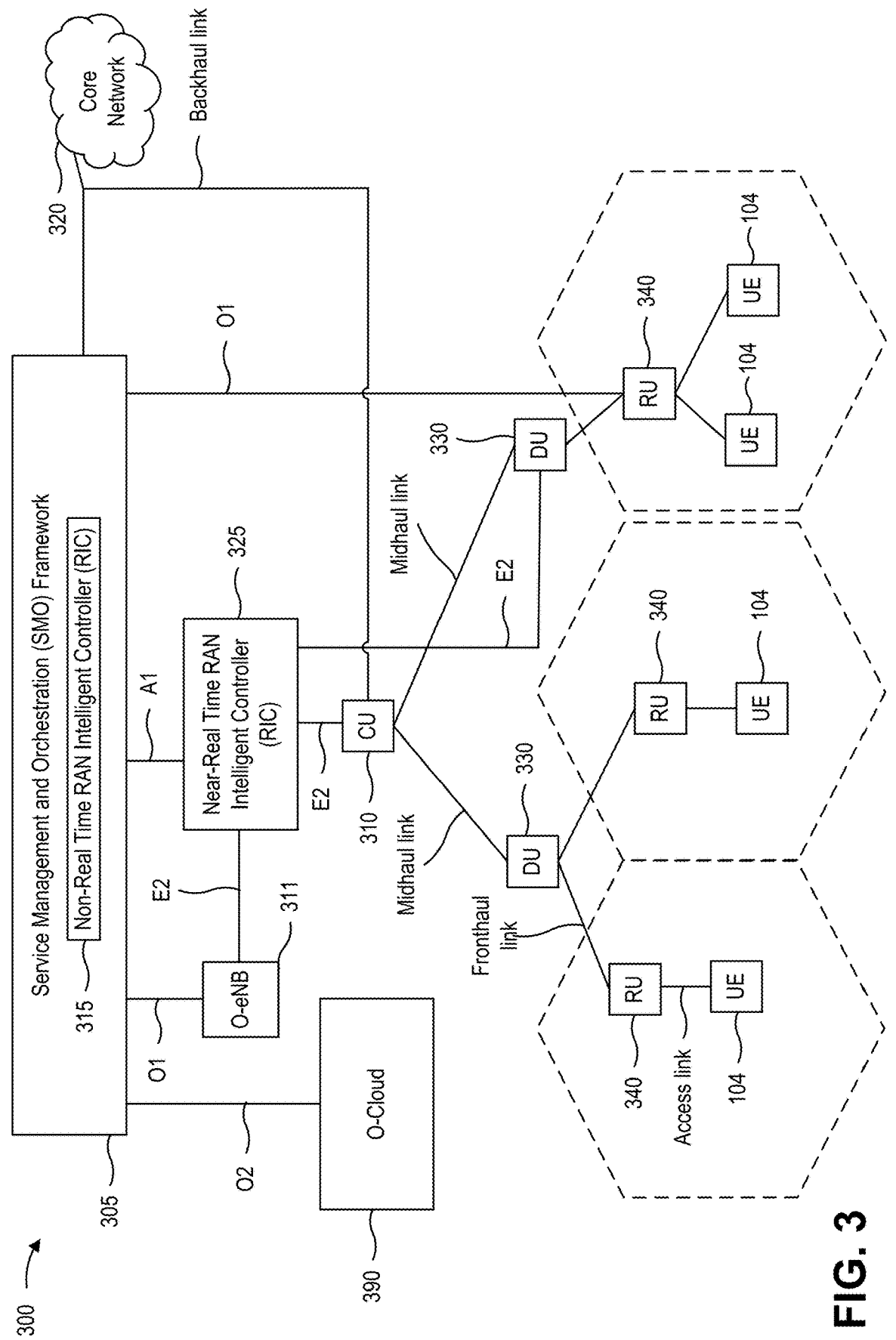
FIG. 3 is a diagram illustrating an example of a disaggregated base station, in accordance with some examples.

FIG. 3 is a diagram illustrating an example disaggregated base station 300 architecture. The disaggregated base station 300 architecture may include one or more central units (CUs) 310 that can communicate directly with a core network 320 via a backhaul link, or indirectly with the core network 320 through one or more disaggregated base station units (e.g., such as a Near-Real Time (Near-RT) RAN Intelligent Controller (RIC) 325 via an E2 link, or a Non-Real Time (Non-RT) RIC 315 associated with a Service Management and Orchestration (SMO) Framework 305, or both). A CU 310 may communicate with one or more distributed units (DUs) 330 via respective midhaul links, such as an F1 interface. The DUs 330 may communicate with one or more radio units (RUS) 340 via respective fronthaul links. The RUs 340 may communicate with respective UEs 104 via one or more radio frequency (RF) access links. In some implementations, the UE 104 may be simultaneously served by multiple RUs 340.

Each of the units (e.g., the CUS 310, the DUs 330, the RUs 340, as well as the Near-RT RICs 325, the Non-RT RICs 315, and the SMO Framework 305) illustrated in FIG. 3 and/or described herein may include one or more interfaces or be coupled to one or more interfaces configured to receive or transmit signals, data, or information (e.g., collectively, signals) via a wired or wireless transmission medium. Each of the units, or an associated processor or controller providing instructions to the communication interfaces of the units, can be configured to communicate with one or more of the other units via the transmission medium. For example, the units can include a wired interface configured to receive or transmit signals over a wired transmission medium to one or more of the other units. Additionally, the units can include a wireless interface, which may include a receiver, a transmitter or transceiver (e.g., such as a radio frequency (RF) transceiver), configured to receive or transmit signals, or both, over a wireless transmission medium to one or more of the other units.

In some aspects, the CU 310 may host one or more higher layer control functions. Such control functions can include radio resource control (RRC), packet data convergence protocol (PDCP), service data adaptation protocol (SDAP), or the like. Each control function can be implemented with an interface configured to communicate signals with other control functions hosted by the CU 310. The CU 310 may be configured to handle user plane functionality (e.g., Central Unit—User Plane (CU-UP)), control plane functionality (e.g., Central Unit—Control Plane (CU-CP)), or a combination thereof. In some implementations, the CU 310 can be logically split into one or more CU-UP units and one or more CU-CP units. The CU-UP unit can communicate bidirectionally with the CU-CP unit via an interface, such as the E1 interface when implemented in an O-RAN configuration. The CU 310 can be implemented to communicate with the DU 330, as necessary, for network control and signaling.

The DU 330 may correspond to a logical unit that includes one or more base station functions to control the operation of one or more RUs 340. In some aspects, the DU 330 may host one or more of a radio link control (RLC) layer, a medium access control (MAC) layer, and one or more high physical (PHY) layers (e.g., such as modules for forward error correction (FEC) encoding and decoding, scrambling, modulation and demodulation, or the like) depending on a functional split, such as those defined by the 3rd Generation Partnership Project (3GPP). In some aspects, the DU 330 may further host one or more low PHY layers. Each layer (or module) can be implemented with an interface configured to communicate signals with other layers (and modules) hosted by the DU 330, or with the control functions hosted by the CU 310.

Lower-layer functionality can be implemented by one or more RUs 340. In some deployments, an RU 340, controlled by a DU 330, may correspond to a logical node that hosts RF processing functions, or low-PHY layer functions (e.g., such as performing fast Fourier transform (FFT), inverse FFT (iFFT), digital beamforming, physical random-access channel (PRACH) extraction and filtering, or the like), or both, based on the functional split, such as a lower layer functional split. In such an architecture, the RU(s) 340 can be implemented to handle over the air (OTA) communication with one or more UEs 104. In some implementations, real-time and non-real-time aspects of control and user plane communication with the RU(s) 340 can be controlled by the corresponding DU 330. In some scenarios, this configuration can enable the DU(s) 330 and the CU 310 to be implemented in a cloud-based RAN architecture, such as a vRAN architecture.

The SMO Framework 305 may be configured to support RAN deployment and provisioning of non-virtualized and virtualized network elements. For non-virtualized network elements, the SMO Framework 305 may be configured to support the deployment of dedicated physical resources for RAN coverage requirements which may be managed via an operations and maintenance interface (e.g., such as an O1 interface). For virtualized network elements, the SMO Framework 305 may be configured to interact with a cloud computing platform (e.g., such as an open cloud (O-Cloud) 390) to perform network element life cycle management (e.g., such as to instantiate virtualized network elements) via a cloud computing platform interface (e.g., such as an O2 interface). Such virtualized network elements can include, but are not limited to, CUs 310, DUs 330, RUS 340, and Near-RT RICs 325. In some implementations, the SMO Framework 305 can communicate with a hardware aspect of a 4G RAN, such as an open eNB (O-eNB) 311, via an O1 interface. Additionally, in some implementations, the SMO Framework 305 can communicate directly with one or more RUs 340 via an O1 interface. The SMO Framework 305 also may include a Non-RT RIC 315 configured to support functionality of the SMO Framework 305.

The Non-RT RIC 315 may be configured to include a logical function that enables non-real-time control and optimization of RAN elements and resources, Artificial Intelligence/Machine Learning (AI/ML) workflows including model training and updates, or policy-based guidance of applications/features in the Near-RT RIC 325. The Non-RT RIC 315 may be coupled to or communicate with (e.g., such as via an A1 interface) the Near-RT RIC 325. The Near-RT RIC 325 may be configured to include a logical function that enables near-real-time control and optimization of RAN elements and resources via data collection and actions over an interface (e.g., such as via an E2 interface) connecting one or more CUs 310, one or more DUs 330, or both, as well as an O-eNB, with the Near-RT RIC 325.

In some implementations, to generate AI/ML models to be deployed in the Near-RT RIC 325, the Non-RT RIC 315 may receive parameters or external enrichment information from external servers. Such information may be utilized by the Near-RT RIC 325 and may be received at the SMO Framework 305 or the Non-RT RIC 315 from non-network data sources or from network functions. In some examples, the Non-RT RIC 315 or the Near-RT RIC 325 may be configured to tune RAN behavior or performance. For example, the Non-RT RIC 315 may monitor long-term trends and patterns for performance and employ AI/ML models to perform corrective actions through the SMO Framework 305 (e.g., such as reconfiguration via 01) or via creation of RAN management policies (e.g., such as A1 policies).

Figure 4:
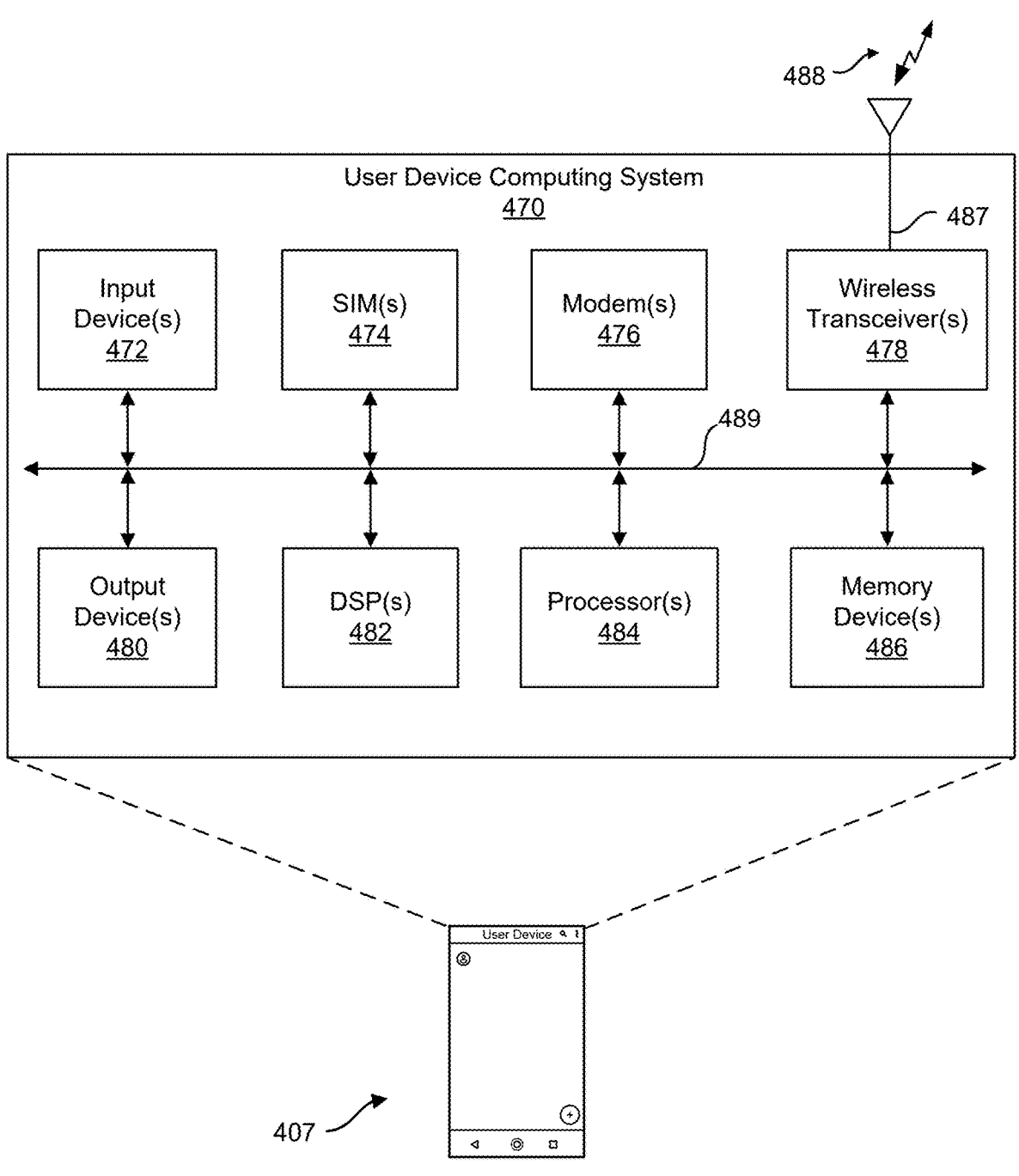
FIG. 4 is a block diagram illustrating components of a user equipment (UE), in accordance with some examples.

FIG. 4 illustrates an example of a computing system 470 of a wireless device 407. The wireless device 407 may include a client device such as a UE (e.g., UE 104, UE 152, UE 190) or other type of device (e.g., a station (STA) configured to communication using a Wi-Fi interface) that may be used by an end-user. For example, the wireless device 407 may include a mobile phone, router, tablet computer, laptop computer, tracking device, wearable device (e.g., a smart watch, glasses, an extended reality (XR) device such as a virtual reality (VR), augmented reality (AR), or mixed reality (MR) device, etc.), Internet of Things (IoT) device, a vehicle, an aircraft, and/or another device that is configured to communicate over a wireless communications network. The computing system 470 includes software and hardware components that may be electrically or communicatively coupled via a bus 489 (e.g., or may otherwise be in communication, as appropriate). For example, the computing system 470 includes one or more processors 484. The one or more processors 484 may include one or more CPUs, ASICs, FPGAS, APs, GPUs, VPUs, NSPs, microcontrollers, dedicated hardware, any combination thereof, and/or other processing device or system. The bus 489 may be used by the one or more processors 484 to communicate between cores and/or with the one or more memory devices 486.

The computing system 470 may also include one or more memory devices 486, one or more digital signal processors (DSPs) 482, one or more SIMs 474, one or more modems 476, one or more wireless transceivers 478, an antenna 487, one or more input devices 472 (e.g., a camera, a mouse, a keyboard, a touch sensitive screen, a touch pad, a keypad, a microphone, and/or the like), and one or more output devices 480 (e.g., a display, a speaker, a printer, and/or the like).

In some aspects, computing system 470 may include one or more radio frequency (RF) interfaces configured to transmit and/or receive RF signals. In some examples, an RF interface may include components such as modem(s) 476, wireless transceiver(s) 478, and/or antennas 487. The one or more wireless transceivers 478 may transmit and receive wireless signals (e.g., signal 488) via antenna 487 from one or more other devices, such as other wireless devices, network devices (e.g., base stations such as eNBs and/or gNBs, Wi-Fi access points (APs) such as routers, range extenders or the like, etc.), cloud networks, and/or the like. In some examples, the computing system 470 may include multiple antennas or an antenna array that may facilitate simultaneous transmit and receive functionality. Antenna 487 may be an omnidirectional antenna such that radio frequency (RF) signals may be received from and transmitted in all directions. The wireless signal 488 may be transmitted via a wireless network. The wireless network may be any wireless network, such as a cellular or telecommunications network (e.g., 3G, 4G, 5G, etc.), wireless local area network (e.g., a Wi-Fi network), a Bluetooth™ network, and/or other network.

In some examples, the wireless signal 488 may be transmitted directly to other wireless devices using sidelink communications (e.g., using a PC5 interface, using a DSRC interface, etc.). Wireless transceivers 478 may be configured to transmit RF signals for performing sidelink communications via antenna 487 in accordance with one or more transmit power parameters that may be associated with one or more regulation modes. Wireless transceivers 478 may also be configured to receive sidelink communication signals having different signal parameters from other wireless devices.

In some examples, the one or more wireless transceivers 478 may include an RF front end including one or more components, such as an amplifier, a mixer (e.g., also referred to as a signal multiplier) for signal down conversion, a frequency synthesizer (e.g., also referred to as an oscillator) that provides signals to the mixer, a baseband filter, an analog-to-digital converter (ADC), one or more power amplifiers, among other components. The RF front-end may generally handle selection and conversion of the wireless signals 488 into a baseband or intermediate frequency and may convert the RF signals to the digital domain.

In some cases, the computing system 470 may include a coding-decoding device (or CODEC) configured to encode and/or decode data transmitted and/or received using the one or more wireless transceivers 478. In some cases, the computing system 470 may include an encryption-decryption device or component configured to encrypt and/or decrypt data (e.g., according to the AES and/or DES standard) transmitted and/or received by the one or more wireless transceivers 478.

The one or more SIMs 474 may each securely store an international mobile subscriber identity (IMSI) number and related key assigned to the user of the wireless device 407. The IMSI and key may be used to identify and authenticate the subscriber when accessing a network provided by a network service provider or operator associated with the one or more SIMs 474. The one or more modems 476 may modulate one or more signals to encode information for transmission using the one or more wireless transceivers 478. The one or more modems 476 may also demodulate signals received by the one or more wireless transceivers 478 in order to decode the transmitted information. In some examples, the one or more modems 476 may include a Wi-Fi modem, a 4G (or LTE) modem, a 5G (or NR) modem, and/or other types of modems. The one or more modems 476 and the one or more wireless transceivers 478 may be used for communicating data for the one or more SIMs 474.

The computing system 470 may also include (and/or be in communication with) one or more non-transitory machine-readable storage media or storage devices (e.g., one or more memory devices 486), which may include, without limitation, local and/or network accessible storage, a disk drive, a drive array, an optical storage device, a solid-state storage device such as a RAM and/or a ROM, which may be programmable, flash-updateable, and/or the like. Such storage devices may be configured to implement any appropriate data storage, including without limitation, various file systems, database structures, and/or the like.

In various aspects, functions may be stored as one or more computer-program products (e.g., instructions or code) in memory device(s) 486 and executed by the one or more processor(s) 484 and/or the one or more DSPs 482. The computing system 470 may also include software elements (e.g., located within the one or more memory devices 486), including, for example, an operating system, device drivers, executable libraries, and/or other code, such as one or more application programs, which may comprise computer programs implementing the functions provided by various aspects, and/or may be designed to implement methods and/or configure systems, as described herein.

FIG. 5 is a diagram illustrating an example 500 of physical channels and reference signals in a wireless network. In some examples, one or more downlink channels and one or more downlink reference signals may carry information from a base station 102 to a UE 104. One or more uplink channels and one or more uplink reference signals may carry information from UE 104 to base station 102.

In some aspects, a downlink channel may include one or more of a physical downlink control channel (PDCCH) that carries downlink control information (DCI), a physical downlink shared channel (PDSCH) that carries downlink data, and/or a physical broadcast channel (PBCH) that carries system information, among other examples. In some aspects, PDSCH communications may be scheduled by PDCCH communications.

In some examples, an uplink channel may include one or more of a physical uplink control channel (PUCCH) that carries uplink control information (UCI), a physical uplink shared channel (PUSCH) that carries uplink data, and/or a physical random access channel (PRACH) used for initial network access, among other examples. In some aspects, UE 104 may transmit acknowledgement (ACK) or negative acknowledgement (NACK) feedback (e.g., ACK/NACK feedback or ACK/NACK information) in UCI on the PUCCH and/or the PUSCH.

In some cases, a downlink reference signal may include one or more of a synchronization signal block (SSB), a channel state information (CSI) reference signal (CSI-RS), a demodulation reference signal (DMRS), a positioning reference signal (PRS), and/or a phase tracking reference signal (PTRS), among other examples. In some examples, an uplink reference signal may include one or more of a sounding reference signal (SRS), a DMRS, and/or a PTRS, among other examples.

An SSB may carry or include information used for initial network acquisition and synchronization. For example, an SSB can carry or include one or more of a primary synchronization signal (PSS), a secondary synchronization signal (SSS), a PBCH, and/or a PBCH DMRS. An SSB may also be referred to as a synchronization signal/PBCH (SS/PBCH) block. In some aspects, base station 102 may transmit multiple SSBs on multiple corresponding beams, and the SSBs may be used for beam selection.

A CSI-RS may carry information used for downlink channel estimation (e.g., downlink CSI acquisition), which may be used for scheduling, link adaptation, or beam management, among other examples. For example, base station 102 can configure a set of CSI-RSs for UE 104, and UE 104 can measure the configured set of CSI-RSs. Based on the CSI-RS measurements, UE 104 can perform channel estimation and report channel estimation parameters to base station 102 (e.g., in a CSI report). For example, the channel estimation parameters can include one or more of a channel quality indicator (CQI), a precoding matrix indicator (PMI), a CSI-RS resource indicator (CRI), a layer indicator (LI), a rank indicator (RI), and/or a reference signal received power (RSRP), among other examples.

In some examples, base station 102 can use the CSI report to select transmission parameters for downlink communications to UE 104. For example, base station 102 can use the CSI report to select transmission parameters that include one or more of a quantity of transmission layers (e.g., a rank), a precoding matrix (e.g., a precoder), a modulation and coding scheme (MCS), and/or a refined downlink beam (e.g., using a beam refinement procedure or a beam management procedure), among other examples.

A DMRS may carry information used to estimate a radio channel for demodulation of an associated physical channel (e.g., PDCCH, PDSCH, PBCH, PUCCH, or PUSCH). The design and mapping of a DMRS may be specific to a physical channel for which the DMRS is used for estimation. DMRSs are UE-specific, can be beamformed, can be confined in a scheduled resource (e.g., rather than transmitted on a wideband), and can be transmitted only when necessary. As shown, DMRSs are used for both downlink communications and uplink communications.

A PTRS can carry information used to compensate for oscillator phase noise. In some cases, oscillator phase noise may increase as an oscillator carrier frequency increases. In some examples, a PTRS can be utilized at high carrier frequencies (e.g., such as millimeter wave frequencies) to mitigate oscillator phase noise. The PTRS may be used to track the phase of the local oscillator and to enable suppression of phase noise and common phase error (CPE). As illustrated in FIG. 5, in some examples one or more PTRSs can be used for both downlink communications (e.g., on the PDSCH) and uplink communications (e.g., on the PUSCH).

A PRS may carry information associated with timing or ranging measurements of UE 104. For example, UE 104 may utilize one or more signals (e.g., PRSs) transmitted by base station 102 to improve an observed time difference of arrival (OTDOA) positioning performance. In some examples, a PRS may be a pseudo-random Quadrature Phase Shift Keying (QPSK) sequence mapped in diagonal patterns with shifts in frequency and time to avoid collision with cell-specific reference signals and control channels (e.g., a PDCCH). A PRS can be designed to improve detectability by UE 104, which may need to detect downlink signals from multiple neighboring base stations in order to perform OTDOA-based positioning. Accordingly, UE 104 may receive a PRS from multiple cells (e.g., a reference cell and one or more neighbor cells), and may report a reference signal time difference (RSTD) based on OTDOA measurements associated with the PRSs received from the multiple cells. In some aspects, base station 102 can calculate a position of UE 104 based on the RSTD measurements reported by UE 104.

In some examples, an SRS can carry information used for uplink channel estimation, which may be used for scheduling, link adaptation, precoder selection, and/or beam management, among other examples. Base station 102 can configure one or more SRS resource sets for UE 104, and UE 104 can transmit SRSs on the configured SRS resource sets. An SRS resource set may have a configured usage, such as uplink CSI acquisition, downlink CSI acquisition for reciprocity-based operations, uplink beam management, among other examples. Base station 102 may measure the SRSs, may perform channel estimation based on the measurements, and/or may use the SRS measurements to configure communications with UE 104.

As noted previously, systems and techniques are provided for redundancy configuration and/or management for non-coherent (e.g., peaky) transmissions between network devices. For example, the systems and techniques can be used to provide redundancy information to a data message transmitted using a set of multiple peaky transmissions (e.g., a plurality of peaky symbols) that are scheduled in time. The redundancy information can correspond to one or more of CRC bits, FEC bits, and/or various other redundancy bits that may be associated with error detection and/or error correction at the receiver of the peaky transmissions.

Figure 6:
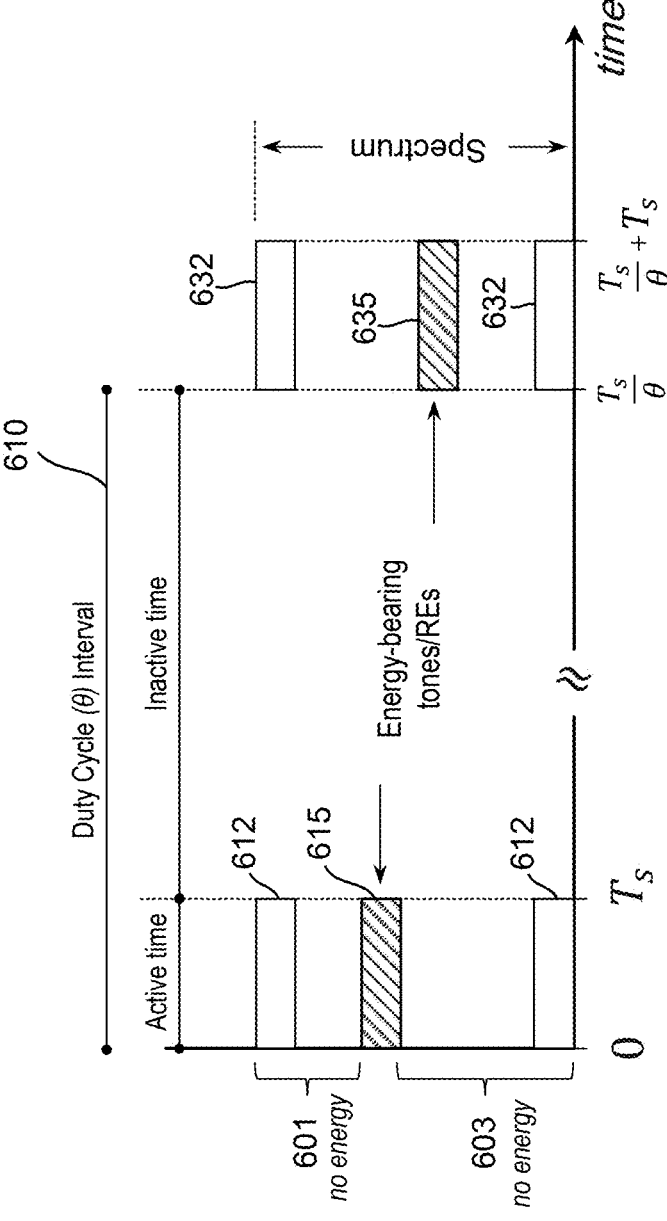
FIG. 6 is a diagram illustrating an example of non-coherent (e.g., peaky) transmissions using a corresponding duty cycle to transmit each peaky symbol, in accordance with some examples.

FIG. 6 is a diagram illustrating an example of non-coherent (e.g., peaky) transmissions 600 using a corresponding duty cycle to transmit each peaky symbol, in accordance with some examples. In some aspects, the non-coherent transmissions 600 may be associated with a plurality of time-frequency resources. For example, the plurality of time-frequency resources can correspond to a grid of resource elements (REs), with separation of time resources provided along the horizontal axis (e.g., time domain) and separation of frequency resources provided along the vertical axis (e.g., frequency domain, spectrum, etc.). For a grid of X time resources along the horizontal axis and Y frequency resources along the vertical axis, the plurality of REs includes one RE for each unique combination or pair of a time resource X and a frequency resource Y. For example, the interval $0\text{-}T_s$ in FIG. 6 can correspond to a first time resource, and can be associated with a set of corresponding REs 612 for the set of sub-carriers of frequency resources available in the spectrum (e.g., a first RE 612 associated with the first time resource and a first subcarrier/frequency resource pair, a second RE 612 associated with the first time resource and a second subcarrier/frequency resource, a third RE 612 associated with the first time resource and a third subcarrier/frequency resource, . . . , etc.).

As noted previously, peaky transmission (e.g., such as the peaky transmissions 600 of FIG. 6) is a type of non-coherent transmission, which does not use phase to encode data bits or other information between the transmitter and the receiver. For example, peaky transmission may be used when a UE or other receiver cannot acquire accurate or reliable CSI or other channel estimate information for the carrier phase tracking needed to decode a coherent transmission. As noted above, as a type of non-coherent transmission, peaky transmission can also be used to increase and/or improve the utilization of time-frequency resources on a channel based on skipping the transmission of a DMRS or other reference signal, pilot tone, pilot sequence, etc., by the transmitter associated with the peaky transmission. For example, performing coherent transmission for the same grid of time-frequency resources of FIG. 6 may require reserving (e.g., utilizing) one or more REs 612 associated with the first time resource (e.g., the $0\text{-}T_s$ time resource) for transmission of the DMRS, and more generally may reserve REs across multiple time and frequency resources prior to beginning any data communications.

In peaky transmission, RF energy is concentrated into a subset of the time resources within a configured transmission interval (e.g., such as a transmission time interval (TTI) or other time duration associated with the transmission of one or more symbols from a network entity to UE, etc.). For example, peaky transmissions 600 of FIG. 6 can be performed based on transmitting during an active time of the duty cycle interval (θ) 610. The active time of the duty cycle interval 610 can correspond to one or more time resources. In some aspects, the active time of the duty cycle interval 610 is at least one time resource. For example, the peaky transmissions 600 of FIG. 6 can be associated with a duty cycle active time that corresponds to transmitting only using the first set of time resources 612 (e.g., between time 0 and time $T_s$) of the plurality of time resources included in the duty cycle interval 610. In some examples, the time $T_s$ may represent the time duration of the peaky signal transmission performed during each duty cycle interval 610 (e.g., the time $T_s$ and the duty cycle active time can be the same). After the active time of the duty cycle interval 610, no further transmission is performed. The time period of no transmission within the duty cycle interval 610 can be referred to as the inactive time of the duty cycle (e.g., duty cycle inactive time), where the duty cycle interval 610 is equal to the sum of the active time and the inactive time.

In some aspects, the duty cycle can be determined as the ratio between the active transmission time and the length (e.g., in time) of the duty cycle interval 610. For example, the duty cycle can be represented as $$\theta = \frac{\text{Active Time}}{\text{Duty Cycle Interval}},$$

where θ is a value between 0 and 1. For example, a duty cycle with θ=0 corresponds to no transmission being performed during the duty cycle interval 610, and a duty cycle with θ=1 corresponds to transmission on at least one RE for each time resource within the duty cycle interval 610 (e.g., continuous transmission). In one illustrative example, for a duty cycle active time of $T_s$ (e.g., the time duration of the peaky transmission or signal), the length of the duty cycle interval 610 can be given as $$\text{Duty Cycle Interval} = \frac{\text{Active Time}}{\theta} = \frac{T_s}{\theta}.$$

For example, the peaky transmissions 600 of FIG. 6 can include a first peaky transmission with a duty cycle interval 610 between 0 and $$\frac{T_s}{\theta},$$

a second peaky transmission with a duty cycle interval 610 of the same length, between $$\frac{T_s}{\theta} \text{ and } 2\left(\frac{T_s}{\theta}\right).$$

etc. The active time of the first peaky transmission can be $T_s$ in length, and can correspond to a transmission during the active time from 0 to $T_s$. The active time of the second peaky transmission can be $T_s$ in length, and can correspond to a transmission during the respective active time from $$\frac{T_s}{\theta} \text{ to } \left(\frac{T_s}{\theta} + T_s\right).$$

In some aspects, each peaky transmission 600 can comprise a pulse (e.g., RF waveform, etc.) that is transmitted with a duty cycle of θ, such that θ<1, and with a peak power of $$P_{peak} = \frac{P_{avg}}{\theta},$$

where $P_{avg}$ represents the average power over the respective duty cycle interval 610. In some examples, the duty cycle parameter θ can be configured such that $$P_{peak} = \frac{P_{avg}}{\theta} \gg P_{avg}.$$

In some examples, the peak transmit power $P_{peak}$ used for a peaky transmission can be increased proportional to the inverse of the duty cycle parameter θ. In some cases, for a fixed or static target value of average transmission power $P_{avg}$ for each peaky transmission duty cycle interval 610, decreasing the duty cycle parameter θ (e.g., using a shorter active transmission time) corresponds to increasing the peak transmit power $P_{peak}$, and increasing the duty cycle parameter θ (e.g., using a longer active transmission time) corresponds to decreasing the peak transmit power $P_{peak}$.

Data or other information can be encoded in the peaky transmissions 600 based on the selection of the frequency resources (e.g., subcarriers) that are used for each respective peaky transmission. For example, different subcarriers can correspond to different REs along the frequency axis (e.g., spectrum) associated with the peaky transmissions 600. In one illustrative example, data or other information is encoded based on the selection of a particular subcarrier from the plurality of subcarriers along the frequency axis of the grid of REs associated with the peaky transmissions 600. In some aspects, different values can be mapped to each respective subcarrier. For example, when four subcarriers are available (e.g., the time-frequency resource grid includes four REs along the frequency axis for each respective time resource), two bits of information can be encoded based on the selection of a particular one of the four subcarriers for the peaky transmission. For example, the index of the first subcarrier can be used to indicate '00', the index of the second subcarrier can be used to indicate '01', the index of the third subcarrier can be used to indicate '10', and the index of the fourth subcarrier can be used to indicate '11', . . . , etc.

The selection of a particular subcarrier or frequency resource for the transmission of a peaky symbol representing or corresponding to a sequence of bits or bit values can also be referred to as index modulation. For example, the first peaky transmission is performed using a first selected RE 615 for transmission of the energy-bearing tone. The first selected RE 615 can be the RE corresponding to the selected subcarrier frequency resource determined based on the index modulation scheme. The first peaky transmission concentrates energy in the time domain to the subset of REs that are within the active time of the duty cycle interval 610, and concentrates energy in the frequency domain to a further subset comprising the REs having an index or subcarrier determined based on the index modulation. For example, the remaining REs 601 above (e.g., higher in frequency than) the energy-bearing RE 615 are associated with no transmitted energy of the first peaky transmission. The remaining REs 603 below (e.g., lower in frequency than) the energy-bearing RE 615 are also associated with no transmitted energy of the first peaky transmission.

The selection of the particular RE 615 from the plurality of REs 612 can be used to communicate or indicate a respective peaky symbol to the receiver, where the respective peaky symbol is the peaky symbol that has been mapped to the particular RE 615. In another example, the second peaky transmission is performed using a second selected RE 635 for transmission of a second peaky symbol, where the second peaky symbol is mapped to the index, subcarrier, frequency, etc., of the RE 635. The RE 635 can be selected from the set of REs 632 located along the frequency axis within the active time of the duty cycle interval 610 of the second peaky transmission. In some cases, the set of REs 632 associated with the second peaky transmission can be the same as or similar to the set of REs 612 associated with the first peaky transmission (e.g., the set of REs 612 and the set of REs 632 can correspond to the same frequency resources and subcarriers, while using different respective time resources). The second peaky transmission can concentrate energy in the time domain to the subset of REs that are within the active time of the second duty cycle interval 610 (e.g., beginning from time $$\frac{T_s}{\theta}\Big),$$

and can concentrate energy in the frequency domain to a further subset comprising the REs having an index or subcarrier determined based on the index modulation for the peaky symbol of the second peaky transmission (e.g., the RE 635). For example, the remaining REs 632 that are above or below the energy-bearing RE 635 receive no transmitted energy during the second peaky transmission.

Each subcarrier index of a plurality of subcarrier indices corresponding to the different frequency resources available within the time-frequency resource grid can be used to signal, via the peaky transmissions 600, a set of correspond peaky symbols. To decode a peaky transmission (e.g., determine the indicated or encoded peaky symbol), the UE or other receiver can be configured to determine or identify the particular subcarrier index used to carry the RF energy of the peaky reception within each duty cycle period or other configured time interval.

Figure 7:
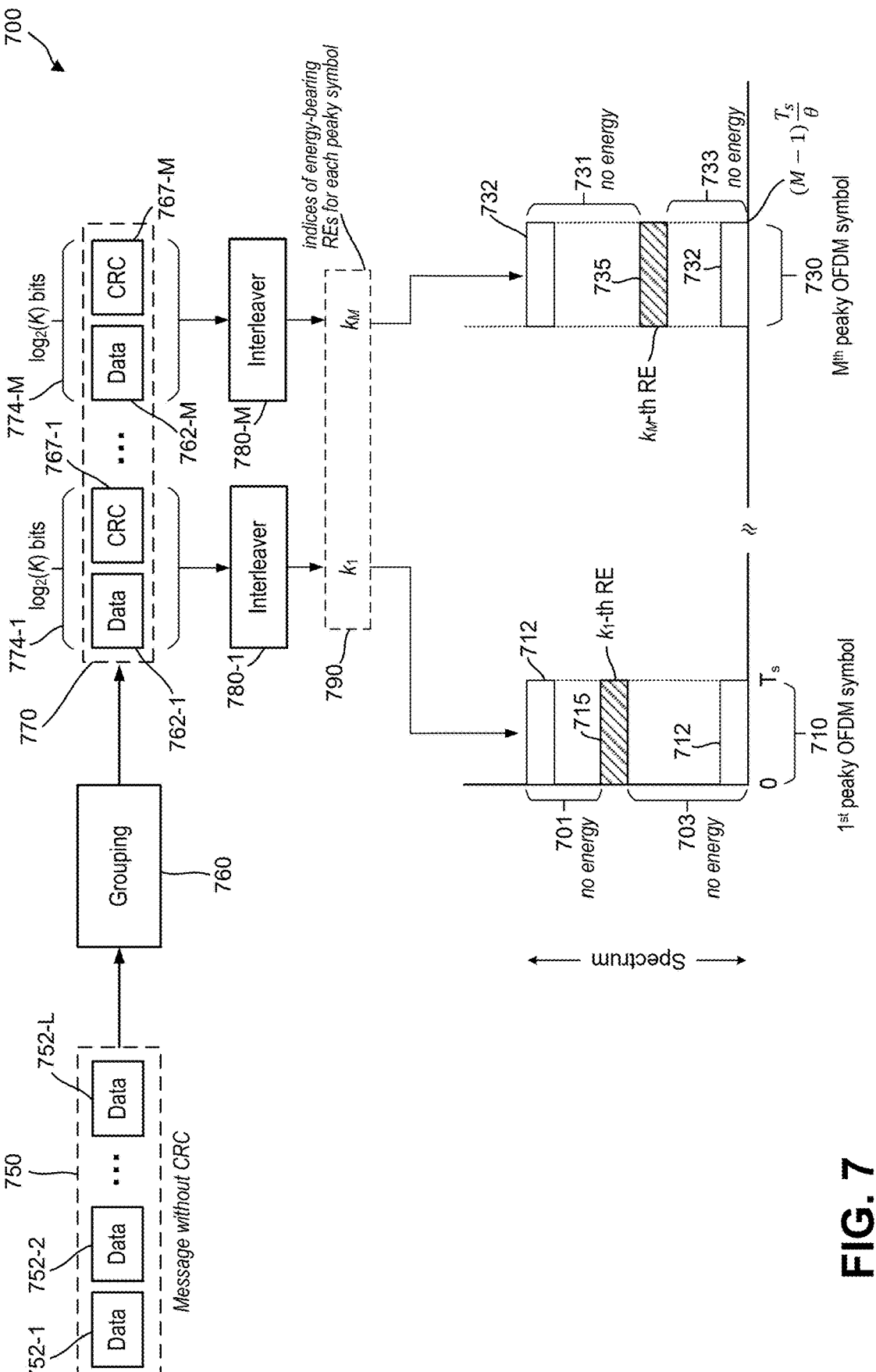
FIG. 7 is a diagram illustrating an example of peaky symbol transmission using per-symbol attachment of redundancy bits including cyclic redundancy check (CRC) bits, in accordance with some examples.
Figure 8:
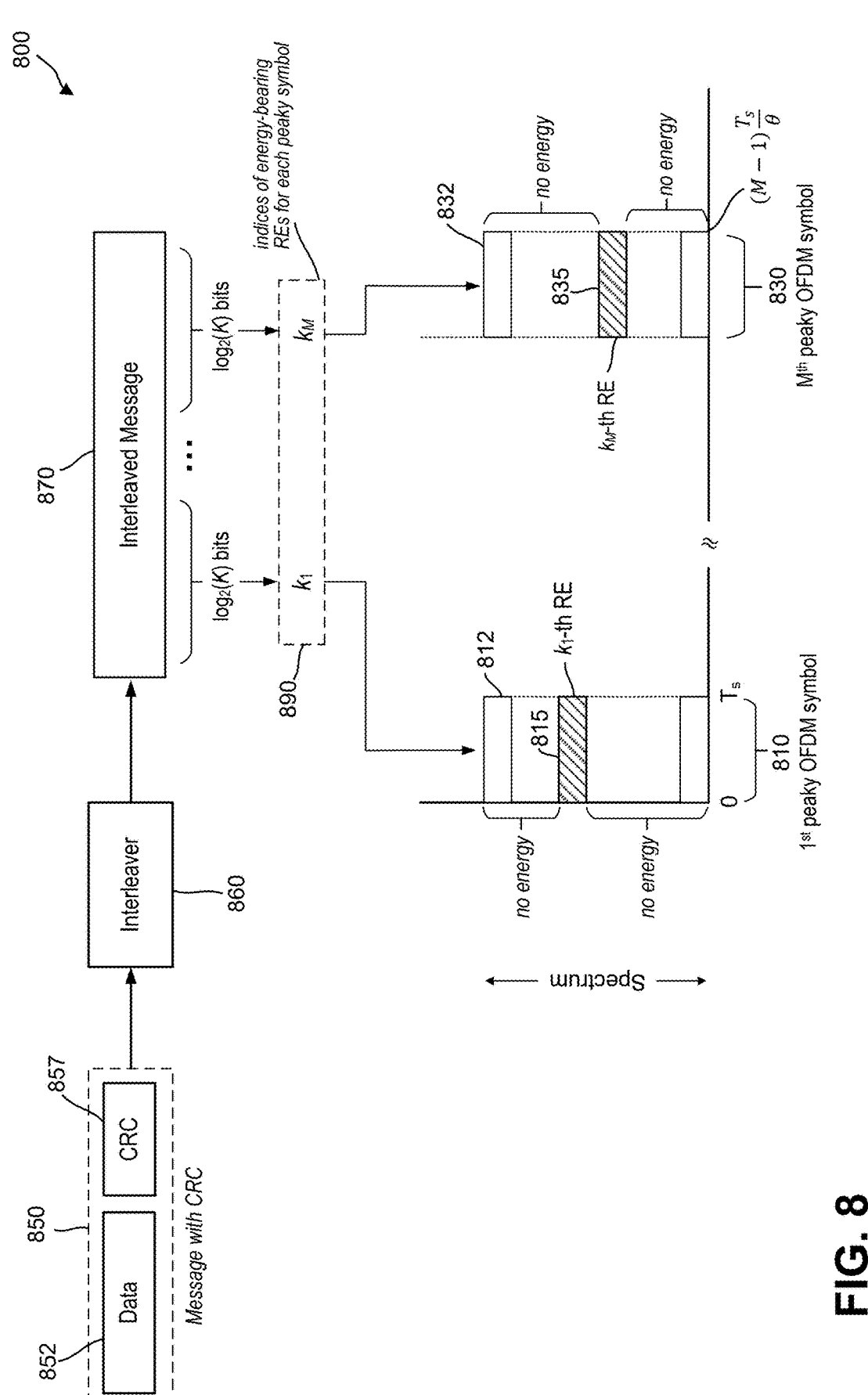
FIG. 8 is a diagram illustrating an example of peaky symbol transmission using per-message attachment of redundancy bits including CRC bits, in accordance with some examples.

As noted previously, the systems and techniques can be used to provide redundancy information for a set of peaky transmission (e.g., a plurality of peaky symbols) that are scheduled in time and correspond to the same (e.g., single) message. The redundancy information can be implemented using redundancy bits that are indicated per symbol or per message. For example, FIG. 7 depicts an example of redundancy bit attachment that is implemented for each symbol of a plurality of peaky symbols scheduled in time and corresponding to the same message. FIG. 8 depicts an example of redundancy bit attachment implemented for the message as a whole (e.g., implemented for the plurality of peaky symbols as a group).

For example, FIG. 7 is a diagram illustrating an example of peaky symbol transmission 700 using per-symbol attachment of redundancy bits. In one illustrative example, the redundancy bits can include cyclic redundancy check (CRC) bits that can be used for error detection. For example, the CRC bits can be calculated based on corresponding data bits and/or other bit values that are encoded for each peaky symbol transmission. The received bit values determined by a UE that receives the peaky symbol with the attached CRC bits can be used to calculate a CRC checksum for the received peaky symbol. The CRC checksum can be compared with the CRC information indicated by the CRC bits attached to the peaky symbol, and error detection can be based on detecting differences between the CRC checksum determined from the received values and the CRC bit values determined from the transmitted values.

For example, peaky transmission can be performed with per-symbol attachment of CRC bits and/or other redundancy bit information (e.g., FEC bits, etc.) determined based on or corresponding to a data message 750. The data message 750 can be a single message that is to be encoded onto a plurality of peaky symbols for non-coherent (e.g., peaky) transmission between network devices. The data message 750 can include a plurality of data bits 752-1, 752-2, . . . , 752-L.

At the transmitter (e.g., base station, gNB, network entity, etc.), the message 750 can be provided to a grouping engine 760, which can be configured to divide the plurality of data bits 752-1-752-L into respective groups of one or more data bits. For example, each group of data bits determined by the grouping engine 760 can correspond to the subset of data bits that are encoded onto a respective peaky symbol of the plurality of peaky symbols used for the transmission of the message 750. For example, the message 750 can include a quantity L of data bits, and the grouping engine can group the L data bits into M different groups 762-1, 762-2, . . . , 762-M. The quantity M of data bits groups generated by the grouping engine 760 can be the same as a quantity M of peaky symbols that are used for the peaky transmission of the message 750.

In some aspects, the quantity M of data bit groups and peaky symbols utilized for the peaky transmission 700 can be less than or equal to the quantity L of individual data bits of the message 750. For example, if each data bit group includes only one data bit, M L. and each peaky symbol is used to encode a single data bit of the message 750. In some aspects, the data bit groups 762-1, 762-2, . . . , 762-M generated or determined as output by the grouping engine 760 can include multiple data bits (e.g., two or more data bits of the plurality of data bits 752-1-752-M of the message 750), and M L.

The grouping engine 760 included in the transmitter (e.g., network entity, base station, gNB, etc.) can be configured to additionally determine a corresponding one or more CRC bits for each data bit grouping 762-1-762-M. For example, a first set of CRC bits 767-1 can be calculated for the first group of data bits 762-1. A second set of CRC bits 767-2 can be calculated for the second group of data bits 762-2, . . . , and an $M^{th}$ set of CRC bits 767-M can be calculated for the $M^{th}$ group of data bits 762-M.

In one illustrative example, the output of the grouping engine 760 can be a plurality of bit sequences 770 that includes a respective set of data bits and corresponding CRC bits for each peaky symbol scheduled for the message 750. For example, the first peaky symbol can correspond to the bits 774-1, which includes the first group of data bits 762-1 and the first set of CRC bits 767-1. The $M^{th}$ peaky symbol can correspond to the bits 774-M, which includes the $M^{th}$ group of data bits 762-M and the $M^{th}$ set of CRC bits 767-M. In some aspects, each peaky symbol can encode a quantity $\log_2(K)$ of bits. In some examples, K represents the number of different subcarriers or frequency resources that are available along the frequency axis of the grid of REs associated with each peaky transmission.

The transmitter can be configured to attach each set of CRC bits 767-1-767-M to the corresponding group of data bits 762-1-762-M for which the CRC was calculated, prior to transmission of the respective peaky symbol. In some examples, one or more interleavers 780-1-780-M can be used to map each set 774-1-774-M of $\log_2(K)$ bits to the corresponding indices 790 of energy-bearing REs for each peaky OFDM symbol. For example, the indices 790 can include an index $k_1$ for the energy-bearing RE configured for or mapped to a first peaky symbol corresponding to the bits 774-1, an index $k_2$ for the energy-bearing RE configured for or mapped to a second peaky symbol corresponding to bits 774-2, . . . , and can include an index $k_M$ for the energy-bearing RE configured for or mapped to an $M^{th}$ peaky symbol corresponding to bits 774-M.

A first peaky OFDM symbol 710 can be transmitted using the $k_1$-th RE 715 as the energy-bearing subcarrier. For example, the $k_1$-th RE 715 can be selected from the plurality of REs available along the frequency domain during the active time of the duty cycle for transmitting the $1^{st}$ peaky OFDM symbol 710, based on the corresponding indication of the index $k_1$ in the mapping information 790 between the indices of the energy-bearing REs and each peaky symbol. The remaining REs 712 during the configured duty cycle active time for the first peaky transmission (e.g., transmission of the $1^{st}$ peaky OFDM symbol 710) are associated with no transmitted energy. For example, the REs 701 higher in frequency receive no transmit energy and the REs 703 lower in frequency receive no transmit energy, and all of the transmit energy for the $1^{st}$ peaky OFDM symbol 710 is concentrated in the $k_1$-th RE 715 as the energy bearing RE.

The last peaky symbol transmitted for the message 750 can be the $M^{th}$ peaky OFDM symbol 730, which can correspond to the group 774-M of data bits 762-M and the corresponding CRC bits 767-M. The $M^{th}$ peaky OFDM symbol 730 can be transmitted based on the corresponding index $k_M$ in the index listing 790 of the energy-bearing REs for each peaky symbol. For example, the $M^{th}$ peaky OFDM symbol 730 can be transmitted using the $k_M$-th RE 735 as the energy-bearing RE for the $M^{th}$ peaky OFDM symbol 730. The remaining REs 732 during the duty cycle active time associated with the $M^{th}$ OFDM symbol 730 receive no transmit energy (e.g., no transmit energy to the set of REs 731 higher in frequency, no transmit energy to the set of REs 733 lower in frequency).

FIG. 8 is a diagram illustrating an example of peaky symbol transmission 800 using per-message attachment of redundancy bits including CRC bits, in accordance with some examples. For example, the peaky symbol transmission 800 can be performed based on encoding a message 850 onto a plurality of peaky symbols, where the message 850 includes a plurality of data bits 852 and further includes a plurality of corresponding CRC bits 857 that are determined based on the plurality of data bits 852.

In one illustrative example, the plurality of data bits 852 that are included within the message 850 of FIG. 8 can be the same as or the plurality of data bits 752-1-752-L that comprise the entire message 750 of FIG. 7. The plurality of corresponding redundancy bits 857 of FIG. 8 can be calculated as a CRC of all data bits included in the message 850, and can also be referred to as per-message CRC bits. For example, the plurality of corresponding CRC bits 857 can be generated based on calculating the CRC for the plurality of data bits 852. In some aspects, the CRC bits 857 are computed for the entire message 850 using a single CRC calculation with the plurality of data bits 852 as input. The quantity of CRC bits included in the plurality of CRC bits 857 using per-message attachment can be the same as or different than the quantity of CRC bits that are generated for the same number message data bits when using the per-symbol attachment of redundancy information of FIG. 7.

The data bits 852 and corresponding CRC bits 857 included in the message 850 can be provided as input to an interleaver 860 of the transmitter, which can apply an interleaving pattern to generate an interleaved message 870 from the input message with CRC 850. The input message with CRC 850 and the interleaved message 870 can have the same bits arranged in a different respective order or sequence. In some aspects, the interleaver 860 can apply the interleaving pattern to generate the interleaved message 870 to include groups of $\log_2(K)$ bits, where each respective bit grouping is encoded onto or represented by one peaky symbol of the plurality of peaky symbols used for the message 850. Each group of $\log_2(K)$ bits within the interleaved message 870 can be mapped to a corresponding RE index 890 indicating the particular RE that will be configured as the energy-bearing RE for transmitting a respective peaky symbol. For example, a first group of $\log_2(K)$ bits of the interleaved message 870 can be mapped to a first RE index $k_1, \ldots,$ and an $M^{th}$ group of $\log_2(K)$ bits of the interleaved message 870 can be mapped to an $M^{th}$ RE index $k_M$ as the energy-bearing RE for the peaky symbol.

Transmission of the respective peaky symbols corresponding to the message with CRC 850 can be the same as or similar to the transmission of the respective peaky symbols corresponding to the message 750 without CRC. For example, the first peaky OFDM symbol 810 can be transmitted using the index of the $k_1$-th RE (of the plurality of RE indices 890) as the energy-bearing RE 815 for the first peaky symbol 810. The transmission of the first peaky symbol 810 with per-message CRC attachment as shown in FIG. 8 can be the same as or similar to the transmission of the first peaky symbol 710 with per-symbol CRC attachment as shown in FIG. 7. The transmission of the $M^{th}$ peaky symbol 830 on the $k_M$-th RE 835 can be based on using the $k_M$-th RE index from the RE indices mapping information 890, and may be the same as or similar to the transmission of the $M^{th}$ peaky symbol 730 of FIG. 7.

In one illustrative example, the UE or other receiver of a plurality of peaky symbols, using either per-symbol CRC attachment (e.g., as in FIG. 7) or per-message CRC attachment (e.g., as in FIG. 8) can receive configuration information indicative of the redundancy bit attachment used by the transmitter of scheduled peaky transmissions to the UE. For example, the transmitter can indicate to the UE, prior to transmitting a plurality of peaky symbols for a message, whether the peaky symbols will be configured with per-symbol CRC attachment or will be configured with per-message CRC attachment. Based on the configuration information for the redundancy bits attached to the plurality of peaky symbols scheduled in time for the same message, the UE can perform corresponding checksum calculations to determine the error control information for the peaky symbol reception for the message.

For example, a plurality of peaky symbols transmitted with per-symbol CRC attachment can be decoded based on the UE or other receiver calculating a CRC checksum for each symbol (e.g., the UE can be configured to calculate and compare CRC checksums on a per-peaky symbol basis, and compare the CRC checksum calculated for each peaky symbol reception to the CRC information indicated by the CRC bits of determined by the transmitter for the peaky symbol transmission). For a plurality of peaky symbols scheduled in time for the same message and transmitted with per-message CRC attachment, the UE cannot calculate CRC checksums or perform error detection for each peaky symbol reception. Because the CRC attachment is per-message, the corresponding CRC checksum calculation at the UE is configured to also be performed on a per-message basis. For example, the transmitter of the plurality of peaky symbols calculates the CRC bits once for the transmitted message as a whole, and the receiver of the plurality of peaky symbols calculates the CRC checksum once for the received plurality of peaky symbols as a whole.

In some aspects, the transmitter of the plurality of peaky symbols scheduled for the same message (e.g., network entity, gNB, base station, etc.) can transmit an indication to the UE ahead of transmitting the first peaky symbol of a message. In some aspects, the indication can be configuration information for the redundancy bits of the scheduled non-coherent (e.g., peaky) transmission from the network entity. In some examples, the indication can indicate a selection between per-symbol or per-message attachment of redundancy bits. In some aspects, the configuration information indicative of the selection between per-symbol CRC attachment and per-message CRC attachment can be indicated dynamically using L1 signaling from the network entity to the UE. In some examples, the configuration information indicative of the selection between per-symbol CRC attachment and per-message CRC attachment can be indicated semi-statically via one or more RRC messages.

In some aspects, the configuration information for the redundancy bits (e.g., the selection between per-symbol and per-message attachment of CRC and/or other redundancy bits) can be determined based on the CRC overhead associated with the two different types of CRC/redundancy bit attachment. For example, per-symbol CRC attachment can be associated with a higher overhead than per-message CRC attachment (e.g., for the same total number of data bits, per-symbol CRC attachment can require a greater number of CRC bits than per-message CRC attachment).

In some cases, the selection between per-symbol and per-message attachment of CRC and/or other redundancy bits can be based on whether partial retransmission capabilities are needed or desired. For example, per-symbol CRC attachment can support partial retransmission of only those symbols for which the UE detects an error based on the comparison between the CRC checksum and CRC bits for each peaky symbol. In some aspects, the UE receiving a plurality of peaky symbols and configured with per-symbol CRC attachment can decode and calculate the CRC checksum for each peaky symbol reception. If or when the UE detects an error in a peaky symbol based on a mismatch between the received CRC bits for the symbol and the CRC checksum calculated for the reception of the symbol, the UE can transmit a retransmission request to the network entity. The retransmission request can be indicative of a request to retransmit only the symbol(s) for which the UE has detected an error based on the CRC checksum calculation and comparison with the corresponding CRC bits of the peaky symbol reception.

While per-symbol CRC attachment can support partial retransmission where the network entity retransmits only the peaky symbol(s) for which the CRC checksum fails at the receiver (e.g., UE), per-message CRC attachment requires the receiver (e.g., UE) to calculate the CRC checksum only once, for the entire message. When per-message CRC attachment is used, the CRC checksum cannot be calculated until the entire message has been received (e.g., until each respective peaky symbol of the plurality of peaky symbols scheduled in time for the message has been received). In some aspects, if the UE determines the checksum fails for the message configured with per-message attachment of the CRC bits, identification of the particular symbol(s) that failed may not be possible, and any retransmission request from the UE is a retransmission request for the entire message (e.g., the UE requests retransmission of the plurality of peaky symbols corresponding to the message). In some cases, per-message CRC attachment with a retransmission provision can be utilized in scenarios with sufficiently relaxed delay constraints to support the retransmission of the entire message (e.g., to support retransmission of the plurality of peaky symbols) when the UE determines a CRC checksum failure for the message.

In some aspects, the selection between per-symbol CRC attachment and per-message CRC attachment can be based on the error performance of the two different configurations for the redundancy bits. For example, to transmit a message with the same number of data bits, per-symbol CRC attachment may use a greater number of peaky symbols than per-message CRC attachment (e.g., based on per-symbol CRC attachment using a greater number of CRC bits (e.g., having higher CRC overhead) than per-message attachment). In some examples, the greater number of CRC bits generated for the same number of data bits when per-symbol CRC attachment is used may correspond to a larger number of total bits that must be encoded and transmitted onto a plurality of peaky symbols (e.g., an increased in the number of CRC bits for the message can correspond to a requirement that more peaky symbols be scheduled in time).

In some cases, increasing the number of peaky symbols used to represent a single message can cause deterioration in the error performance associated with receiving the message by the UE. For example, the deterioration in error performance of the receiver can be based on the need for the receiver to detect all of the transmitted peaky symbols without any error in order to recover (e.g., decode) the message in its entirety. For instance, if each peaky symbol has the same probability $p_e$ of experiencing a detection error at the UE, the probability of error free detection of a respective peaky symbol is $1-p_e$. For a message transmitted on n different peaky symbols, the message is recovered without error with probability $(1-p_e)^n$, and increasing the quantity of peaky symbols n per message therefore decreases the error performance of the receiver by decreasing the probability of the message being recovered without error.

In some aspects, per-symbol CRC attachment and per-message CRC attachment can be performed using the same number of peaky symbols to transmit respective messages that encode the same number of data bits.

Figure 9A:
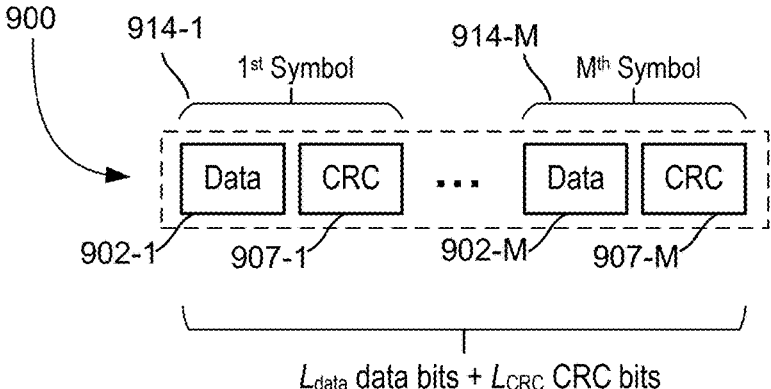
FIG. 9A is a diagram illustrating an example of a plurality of peaky symbols with per-symbol attachment of redundancy bits, where each peaky symbol includes respective data bits and corresponding redundancy bits (e.g., CRC bits) based on the respective data bits, in accordance with some examples.

For example, FIG. 9A is a diagram illustrating an example of a plurality of peaky symbols 900 with per-symbol attachment of redundancy bits, where each peaky symbol 914-1, . . . , 914-M includes respective data bits 902-1, . . . , 902-M and corresponding redundancy bits (e.g., CRC bits) 907-1, . . . , 907-M based on the respective data bits, in accordance with some examples. In some aspects, the plurality of peaky symbols 900 with per-symbol CRC attachment can be the same as or similar to the plurality of symbols 770 of FIG. 7. For example, the peaky symbol bits 914-1 of FIG. 9A can be the same as or similar to the peaky symbol bits 774-1 of FIG. 7, the peaky symbol bits 914-M of FIG. 9A can be the same as or similar to the peaky symbol bits 774-M of FIG. 7, etc. In some examples, the data bits 902-1, . . . , 902-M of FIG. 9A can be the same as or similar to the data bit groupings 762-1, . . . , 762-M of FIG. 7, and the corresponding CRC bits 907-1, . . . , 907-M of FIG. 9A can be the same as or similar to the corresponding CRC bits 767-1, . . . , 767-M of FIG. 7.

Figure 9B:
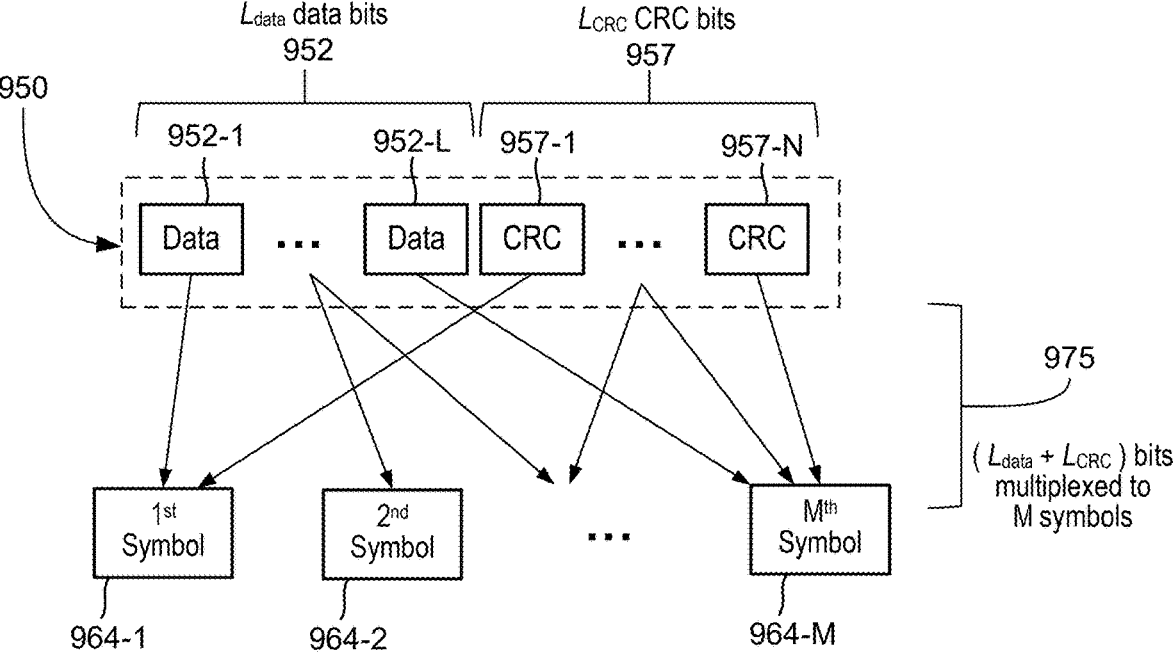
FIG. 9B is a diagram illustrating an example of a plurality of peaky symbols with per-message attachment of redundancy bits, where a plurality of data bits and a plurality of redundancy bits determined for a message are multiplexed to the plurality of peaky symbols, in accordance with some examples.

FIG. 9B is a diagram illustrating an example of a plurality of peaky symbols 950 with per-message attachment of redundancy bits, where a plurality 952 of data bits $L_{data}$ and a plurality 957 of redundancy bits $L_{CRC}$ determined for a message are multiplexed to a plurality of peaky symbols 964-1, 964-2, . . . , 964-M based on a multiplexing or interleaving pattern 975, in accordance with some examples. In some aspects, the peaky symbol bits 950 with per-message CRC attachment can be the same as or similar to the bits of the interleaved message 870 of FIG. 8. In some examples, the plurality 952 of data bits $L_{data}$ of FIG. 9B can be the same as or similar to the plurality of data bits 852 included in the message 850 of FIG. 8. IN some cases, the plurality 957 of redundancy bits $L_{CRC}$ of FIG. 9B can be the same as or similar to the plurality of redundancy bits 857 of FIG. 8. In some aspects, the multiplexing pattern 975 of FIG. 9B can be implemented by the interleaver 860 of FIG. 8. In some cases, the multiplexing pattern 975 of FIG. 9B can also be referred to as an interleaving pattern. The multiplexing pattern 975 can be used to multiplex the respective data bits 952-1, . . . , 952-L included in the plurality 952 of data bits $L_{data}$ and the respective CRC bits 957-1, . . . , 957-N included in the plurality 957 of CRC bits $L_{CRC}$ onto a corresponding one (or more) of the peaky symbols 964-1, 964-2, . . . , 964-M included in the plurality of peaky symbols used for transmission of the message 950 with per-message CRC attachment.

In some cases, each symbol of the plurality of peaky symbols 964-1-964-M can include at least one data bit from the plurality 952 of data bits $L_{data}$. In some aspects, each symbol of the plurality of peaky symbols 964-1-964-M can include at least one CRC redundancy bit from the plurality 957 of redundancy bits $L_{CRC}$. In some examples, each symbol of the plurality of peaky symbols 964-1-964-M includes at least one data bit from the plurality 952 of data bits $L_{data}$ and at least one CRC redundancy bit from the plurality 957 of redundancy bits $L_{CRC}$. In some aspects, one or more peaky symbols of the plurality of peaky symbols 964-1-964-M can include only data bits from the plurality 952 of data bits $L_{data}$ (e.g., does not include any of the CRC bits 957 $L_{CRC}$). In some cases, one or more peaky symbols of the plurality of peaky symbols 964-1-964-M can include only CRC bits from the plurality 957 of CRC bits $L_{CRC}$ (e.g., does not include any of the data bits 952 $L_{data}$).

In some aspects, the per-symbol CRC attachment of FIG. 9A and the per-message CRC attachment of FIG. 9B can be implemented for the same number of data bits $L_{data}$, and can utilize the same number of peaky symbols for transmitting the message 900 or 950 (respectively). For example, the per-symbol CRC attachment of FIG. 9A and the per-message CRC attachment of FIG. 9B can utilize the same number of peaky symbols based on the per-symbol CRC attachment and the per-message CRC attachment being associated with the same CRC overhead (e.g., the number of CRC bits increases linearly with the number of data bits).

In some examples, the per-symbol CRC attachment of FIG. 9A and the per-message CRC attachment of FIG. 9B can be implemented for the same number of data bits $L_{data}$, and can utilize the same number of peaky symbols for transmitting the message 900 or 950 (respectively) in scenarios where the per-symbol CRC attachment of FIG. 9A has a greater number of CRC bits $L_{CRC}$ than the number of CRC bits 957 $L_{CRC}$ associated with the per-message CRC attachment of FIG. 9B, but the larger number of per-symbol CRC bits can still be encoded onto the same number of peaky symbols as the plurality of peaky symbols 964-1-964-M used for the per-message CRC attachment of FIG. 9B.

In some aspects, the redundancy bits described herein can include CRC bits and may further include one or more FEC bits. For example, in some aspects the redundancy bits can comprise only CRC bits, determined either per-peaky symbol or per-message comprising a plurality of peaky symbols. In one illustrative example, the redundancy bits can include both CRC bits and FEC bits.

In some examples, where the redundancy bits include FEC bits, the FEC bits can be attached on a per-symbol or per-message basis, in a same or similar manner as described above with respect to the CRC bits. In one illustrative example, if CRC bits are already attached to data bits (e.g., if the redundancy bits include both CRC and FEC bits), the systems and techniques can implement the FEC encoding to generate and/or attach the additional FEC redundancy bits according to the same type of attachment (e.g., per-symbol or per-message) that was used for the attachment of the CRC bits. For example, when the redundancy bits include CRC and FEC bits, the plurality of peaky symbols can be transmitted using per-symbol attachment of CRC bits and per-symbol attachment of FEC bits. In another example, when the redundancy bits include CRC and FEC bits, the plurality of peaky symbols can be transmitted using per-message attachment of CRC bits and per-message attachment of FEC bits. In some aspects, the attachment configuration for FEC bits that are included in the plurality of redundancy bits for a message along with the set of CRC bits can be configured to follow the same signaling of per-symbol or per-message attachment used for the CRC bits. In these examples, a single signaling indication (e.g., L1, RRC, etc.) can be received by the UE from the network entity, and the signaled indication of per-symbol or per-message attachment can be used by the UE to decode both the CRC bits and the FEC bits included in the plurality of redundancy bits associated with the plurality of peaky symbols scheduled in time for a same message. In some cases, the selection of a per-symbol configuration for FEC bit attachment or the selection of a per-message configuration for FEC bit attachment can be signaled to the UE using dynamic L1 signaling and/or semi-static RRC messages from the network entity (e.g., transmitter of the scheduled peaky symbols scheduled in time for the same message). In some cases, separate configuration information for CRC bit attachment and FEC bit attachment can be transmitted, where the separate configuration information is both indicative of either per-symbol attachment or per-message attachment for the respective CRC or FEC bits. In some cases, the network entity may configure per-message FEC attachment (and therefore, per-message CRC attachment if the redundancy bits also include CRC bits) based on energy budget limitations of the receiver (e.g., such as ambient IoT devices that are implemented as the receiver(s) of the plurality of peaky transmissions scheduled in time for a same message, etc.).

FIG. 10 is a flowchart diagram illustrating an example of a process 1000 for wireless communications. In some aspects, the process 1000 can be a process for wireless communications by a network device (e.g., a UE, etc.). For example, the process 1000 can be a process for wireless communications by a UE. In some examples, the process 1000 can be performed by a network device or apparatus or a component or system (e.g., one or more chipsets, one or more processors such as one or more CPUs, DSPs, NPUs, NSPs, microcontrollers, ASICs, FPGAs, programmable logic devices, discrete gates or transistor logic components, discrete hardware components, etc., any combination thereof, and/or other component or system) of the network device or apparatus. The operations of the process 1000 may be implemented as software components that are executed and run on one or more processors (e.g., processor 1210 of FIG. 12 or other processor(s)). In some examples, the process 1000 can be performed by a UE, including any of the UEs of FIGS. 1-9B. In some aspects, the process 1000 can be performed by a UE, smartphone, mobile computing device, user computer device, etc. The process 1000 can be performed by a component or system (e.g., a chipset) of a network device (e.g., one or more of UEs 104, 152, 164, 182, 190 of FIG. 1; UE 104 of FIG. 2; UE(s) 104 of FIG. 3; wireless device 407 of FIG. 4; computing system 1200 of FIG. 12; etc.). The network device may be a mobile device (e.g., a mobile phone), a network-connected wearable such as a watch, an extended reality (XR) device such as a virtual reality (VR) device or augmented reality (AR) device, a vehicle or component or system of a vehicle, or other type of computing device. The operations of the process 1000 may be implemented as software components that are executed and run on one or more processors (e.g., processor 484 of FIG. 4, processor 1210 of FIG. 12, and/or other processor(s)). Further, the transmission and reception of signals by the wireless device in the process 1000 may be enabled, for example, by one or more antennas (e.g., antennas 252 of FIG. 2, antenna 487 of FIG. 4, etc.) and/or one or more transceivers (e.g., wireless transceiver(s) 478 of FIG. 4, etc.).

At block 1002, the network device (or component thereof) can receive configuration information for redundancy bits associated with scheduled non-coherent transmissions. For example, the configuration information can be associated with redundancy bits such as the CRC bits 767-1, . . . , 767-M of FIG. 7, the CRC bits 857 of FIG. 8, the CRC bits 907-1, . . . , 907-M of FIG. 9A, the CRC bits 957-1, . . . , 957-N of FIG. 9B, etc.

In some examples, the configuration information for the redundancy bits can comprise dynamic configuration information received by the network device (e.g., UE) in Layer 1 (L1) signaling information. In some cases, the configuration information for the redundancy bits can comprise dynamic configuration information received by the network device (e.g., UE) in semi-static configuration information received by the network device in a radio resource control (RRC) configuration. In some cases, the configuration information for the redundancy bits can be received by a UE from a network entity (e.g., base station, gNB, etc.) associated with the UE.

In some cases, the network device (or component thereof) can receive, from an additional network device (e.g., network entity, base station, gNB, etc.), the configuration information for the redundancy bits associated with scheduled non-coherent transmissions, and can receive, from the additional network device, the plurality of non-coherent transmissions corresponding to the message.

At block 1004, the network device (or component thereof) can receive a plurality of non-coherent transmissions corresponding to a message, the message including a plurality of data bits and a plurality of redundancy bits, wherein each non-coherent transmission of the plurality of non-coherent transmissions is associated with a duty cycle corresponding to the scheduled non-coherent transmissions.

For example, the plurality of non-coherent transmission can correspond to a message such as the message 750 of FIG. 7, the message 850 of FIG. 8, the message 900 of FIG. 9A, the message 950 of FIG. 9B, etc. In some cases, the plurality of non-coherent transmissions can comprise plurality of symbols, where each symbol of the plurality of symbols transmitted using a duty cycle. For example, the plurality of non-coherent transmission can comprise a plurality of symbols, such as the symbols 710, . . . , 730 of FIG. 7, the symbols 810, . . . , 830 of FIG. 8, etc. The duty cycle can be the same as or similar to the duty cycle associated with the duty cycle interval 610 of FIG. 6, etc.

In some examples, each non-coherent transmission of the plurality of non-coherent transmissions is a peaky symbol received without channel state information (CSI) acquisition by the network device. For example, the peaky symbol may be the same as or similar to one or more of the peaky symbols of FIG. 6, one or more of the peaky symbols 710, . . . , 730 of FIG. 7, one or more of the peaky symbols 810, . . . , 830 of FIG. 8, etc.

In some cases, the plurality of data bits included in the message can be the same as or similar to the data bits 752-1, 752-2, . . . , included in the message 750 of FIG. 7 and/or the data bits 762-1, . . . , 762-M included in the message 770 of FIG. 7. In some examples, the plurality of data bits included in the message can be the same as or similar to the data bits 852 included in the message 850 of FIG. 8 and/or the data bits included in the interleaved message 870 of FIG. 8. In some cases, the plurality of data bits included in the message can be the same as or similar to the data bits 902-1, . . . , 902-M included in the message 900 of FIG. 9A. In some examples, the plurality of data bits included in the message can be the same as or similar to the data bits 952-1, . . . , 952-L included in the message 950 of FIG. 9B.

In some cases, the plurality of redundancy bits includes a plurality of cyclic redundancy check (CRC) bits, and the error control information comprises a CRC checksum value.

For example, the plurality of redundancy bits can include CRC bits the same as or similar to one or more of the CRC bits 767-1, . . . , 767-M of FIG. 7, the CRC bits 857 of FIG. 8, the CRC bits 907-1, . . . , 907-M of FIG. 9A, the CRC bits 957-1, . . . , 957-N of FIG. 9B, etc.

In some cases, the plurality of redundancy bits includes one or more cyclic redundancy check (CRC) bits corresponding to a respective CRC determined for each non-coherent transmission of the plurality of non-coherent transmissions. The respective CRC determined for each non-coherent transmission of the plurality of non-coherent transmissions can be a CRC determined for corresponding data bits included in each non-coherent transmission, the corresponding data bits included in the plurality of data bits and indicative of a symbol represented by each non-coherent transmission.

In some cases, the one or more CRC bits corresponding to the respective CRC determined for each non-coherent transmission can be interleaved with the corresponding data bits included in each non-coherent transmission. For example, the CRC bits can be interleaved using the interleavers 780-1, . . . , 780-M of FIG. 7 and/or the interleaver 860 of FIG. 8. In some cases, each non-coherent transmission of the plurality of non-coherent transmissions comprises the corresponding data bits indicative of the symbol represented by each non-coherent transmission, and the one or more CRC bits corresponding to the respective CRC determined for each non-coherent transmission, wherein the one or more CRC bits are based on the corresponding data bits.

In some examples, the plurality of redundancy bits further includes one or more forward error correction (FEC) bits. For example, the one or more FEC bits can be included in the plurality of redundancy bits in the interleaved message 870 of FIG. 8 and/or the message 770 of FIG. 7.

In some cases, the plurality of redundancy bits includes a plurality of cyclic redundancy check (CRC) bits corresponding to a CRC determined for the plurality of data bits included in the message. For example, the plurality of CRC bits corresponding to a CRC determined for the plurality of data bits included in the message can be the same as or similar to the plurality of CRC bits 857 corresponding to a CRC determined for the plurality of data bits 852 included in the message 850 of FIG. 8.

In some cases, the plurality of redundancy bits are multiplexed with the plurality of non-coherent transmissions using a multiplexing pattern. For example, the multiplexing pattern can be implemented by the interleaver 860 of FIG. 8, can be implemented by the interleavers 780-1, . . . , 780-M of FIG. 7, etc. In some examples, a first transmission of the plurality of non-coherent transmissions does not include CRC bits corresponding to the CRC, and the network device is configured to determine the error control information for the plurality of data bits included in the message, wherein the error control information is determined after all transmissions of the plurality of non-coherent transmissions are received.

At block 1006, the network device (or component thereof) can determine error control information for one or more data bits of the plurality of data bits using corresponding redundancy bits of the plurality of redundancy bits, wherein the corresponding redundancy bits are determined based on the configuration information.

For example, the network device (or component thereof) can be configured to determine respective error control information for each non-coherent transmission of the plurality of non-coherent transmissions, based on corresponding data bits of each non-coherent transmission and the one or more CRC bits corresponding to the respective CRC for each non-coherent transmission. In some cases, the respective error control information for each non-coherent transmission of the plurality of non-coherent transmissions is determined before a next transmission of the plurality of non-coherent transmissions is received.

In some cases, the plurality of redundancy bits further includes one or more forward error correction (FEC) bits, and the error control information further comprises one or more error corrections based on the one or more FEC bits. In some examples, the plurality of redundancy bits includes a plurality of forward error correction (FEC) bits, and the error control information comprises one or more error corrections determined based on the plurality of FEC bits and data bits decoded from the plurality of non-coherent transmissions.

In some examples, the network device (or component thereof) can be configured to receive, from an additional network device, the configuration information for the redundancy bits associated with scheduled non-coherent transmissions. The network device (or component thereof) can receive, from the additional network device, the plurality of non-coherent transmissions corresponding to the message. In some cases, the network device (or component thereof) is configured to transmit, to the additional network device, a retransmission request based on one or more detected errors within the error control information. The configuration information can be indicative of scheduled non-coherent transmissions by the additional network device using per-transmission attachment between respective redundancy bits of the plurality of redundancy bits and each non-coherent transmission of the plurality of non-coherent transmissions. The retransmission request can be a request to the additional network device for retransmission of a particular transmission of the plurality of non-coherent transmissions, where the one or more detected errors correspond to data bits within the particular transmission.

In some cases, the network device (or component thereof) can be configured to transmit, to the additional network device, a retransmission request based on one or more detected errors within the error control information. The configuration information can be indicative of scheduled non-coherent transmissions by the additional network device using per-message attachment between the plurality of redundancy bits and the plurality of non-coherent transmissions corresponding to the message. The retransmission request can be a request to the additional network device for retransmission of the plurality of non-coherent transmissions corresponding to the message.

FIG. 11 is a flowchart diagram illustrating another example of a process 1100 for wireless communications. For example, the process 1100 can be a process for wireless communications by a network entity (e.g., a base station, gNB, etc.). In some examples, the process 1100 can be performed by a computing device or apparatus or a component or system (e.g., one or more chipsets, one or more processors such as one or more CPUs, DSPs, NPUs, NSPs, microcontrollers, ASICs, FPGAs, programmable logic devices, discrete gates or transistor logic components, discrete hardware components, etc., any combination thereof, and/or other component or system) of the network entity or apparatus. The operations of the process 1100 may be implemented as software components that are executed and run on one or more processors (e.g., processor 1210 of FIG. 12 or other processor(s)). In some examples, the process 1100 can be performed by a component or system (e.g., a chipset) of a network entity (e.g., a base station, gNB, etc.). For instance, the network entity can be the same as or similar to one or more of the base stations 102 of FIG. 1, the mmW base station 180 of FIG. 1, the AP 150 of FIG. 1, the base station 102 of FIG. 2, one or more base stations or network entities of FIG. 3, the base stations 102 of FIG. 5, computing system 1200 of FIG. 12; etc.). The operations of the process 1100 may be implemented as software components that are executed and run on one or more processors (e.g., processor 484 of FIG. 4, processor 1210 of FIG. 12, and/or other processor(s)). Further, the transmission and reception of signals by the network entity in the process 1100 may be enabled, for example, by one or more antennas (e.g., antennas 252 of FIG. 2, antenna 487 of FIG. 4, etc.) and/or one or more transceivers (e.g., wireless transceiver(s) 478 of FIG. 4, etc.).

At block 1102, the network entity (or component thereof) can transmit configuration information for redundancy bits associated with scheduled non-coherent transmissions. For example, the configuration information can be the same as or similar to the configuration information received by the network device at block 1002 of the process 1000 of FIG. 10.

At block 1104, the network entity (or component thereof) can transmit a plurality of non-coherent transmissions corresponding to a message, the message including a plurality of data bits and a plurality of redundancy bits, wherein each non-coherent transmission of the plurality of non-coherent transmissions is associated with a duty cycle corresponding to the scheduled non-coherent transmissions. For example, the plurality of non-coherent transmissions corresponding to the message can be the same as or similar to the plurality of non-coherent transmissions received by the network device at block 1004 of the process 1000 of FIG. 10.

For example, the plurality of non-coherent transmissions can correspond to a message such as the message 750 of FIG. 7, the message 850 of FIG. 8, the message 900 of FIG. 9A, the message 950 of FIG. 9B, etc. In some cases, the plurality of non-coherent transmissions can comprise plurality of symbols, where each symbol of the plurality of symbols transmitted using a duty cycle. For example, the plurality of non-coherent transmission can comprise a plurality of symbols, such as the symbols 710, . . . , 730 of FIG. 7, the symbols 810, . . . , 830 of FIG. 8, etc. The duty cycle can be the same as or similar to the duty cycle associated with the duty cycle interval 610 of FIG. 6, etc.

In some examples, each non-coherent transmission of the plurality of non-coherent transmissions is a peaky symbol. For example, the peaky symbol may be the same as or similar to one or more of the peaky symbols of FIG. 6, one or more of the peaky symbols 710, . . . , 730 of FIG. 7, one or more of the peaky symbols 810, . . . , 830 of FIG. 8, etc.

In some cases, the plurality of data bits included in the message can be the same as or similar to the data bits 752-1, 752-2, . . . , included in the message 750 of FIG. 7 and/or the data bits 762-1, . . . , 762-M included in the message 770 of FIG. 7. In some examples, the plurality of data bits included in the message can be the same as or similar to the data bits 852 included in the message 850 of FIG. 8 and/or the data bits included in the interleaved message 870 of FIG. 8. In some cases, the plurality of data bits included in the message can be the same as or similar to the data bits 902-1, . . . , 902-M included in the message 900 of FIG. 9A. In some examples, the plurality of data bits included in the message can be the same as or similar to the data bits 952-1, . . . , 952-L included in the message 950 of FIG. 9B.

In some cases, the plurality of redundancy bits includes a plurality of cyclic redundancy check (CRC) bits, and the error control information comprises a CRC checksum value. For example, the plurality of redundancy bits can include CRC bits the same as or similar to one or more of the CRC bits 767-1, . . . , 767-M of FIG. 7, the CRC bits 857 of FIG. 8, the CRC bits 907-1, . . . , 907-M of FIG. 9A, the CRC bits 957-1, . . . , 957-N of FIG. 9B, etc.

At block 1106, the network entity (or component thereof) can receive a request for retransmission of one or more non-coherent transmissions of the plurality of non-coherent transmission, the request based on error control information determined for one or more data bits of the plurality of data bits using corresponding redundancy bits selected from the plurality of redundancy bits based on the configuration information.

For example, the request for retransmission can be a request for retransmission generated based on the error control information determined by the network device at block 1006 of the process 1000 of FIG. 10. In some cases, the retransmission request can be received from a network device (e.g., UE) associated with the network entity. The retransmission request can be from a network device (e.g., UE) that received the configuration information and/or at least a portion of the plurality of non-coherent transmissions corresponding to a message that are transmitted by the network entity. In some cases, the retransmission request can be based on one or more detected errors within the error control information. The configuration information can be indicative of scheduled non-coherent transmissions by the network entity using per-transmission attachment between respective redundancy bits of the plurality of redundancy bits and each non-coherent transmission of the plurality of non-coherent transmissions. The retransmission request can be a request to the network entity (or component thereof) for retransmission of a particular transmission of the plurality of non-coherent transmissions, where the one or more detected errors correspond to data bits within the particular transmission.

In some cases, the retransmission request can be received by the network entity (or component thereof) based on one or more detected errors within the error control information. The configuration information can be indicative of scheduled non-coherent transmissions by the network entity (or component thereof) using per-message attachment between the plurality of redundancy bits and the plurality of non-coherent transmissions corresponding to the message. The retransmission request can be a request to the network entity (or component thereof) for retransmission of the plurality of non-coherent transmissions corresponding to the message.

In some examples, the processes described herein (e.g., process 1000, process 1100, and/or other process described herein) may be performed by a computing device or apparatus (e.g., a network node such as a UE, base station, a portion of a base station, etc.). For instance, as noted above, the process 1000 may be performed by a UE and the process 1100 may be performed by a base station or a portion of a base station. In another example, the process 1000 and/or the process 1100 may be performed by a computing device with the computing system 1200 shown in FIG. 12. For instance, a wireless communication device with the computing architecture shown in FIG. 12 may include the components of the UE and/or the network entity (e.g., base station, gNB, etc.) and may implement the operations of FIG. 10 and/or FIG. 11.

In some cases, the computing device or apparatus may include various components, such as one or more input devices, one or more output devices, one or more processors, one or more microprocessors, one or more microcomputers, one or more cameras, one or more sensors, and/or other component(s) that are configured to carry out the steps of processes described herein. In some examples, the computing device may include a display, one or more network interfaces configured to communicate and/or receive the data, any combination thereof, and/or other component(s). The one or more network interfaces may be configured to communicate and/or receive wired and/or wireless data, including data according to the 3G, 4G, 5G, and/or other cellular standard, data according to the WiFi (802.11x) standards, data according to the Bluetooth™ standard, data according to the Internet Protocol (IP) standard, and/or other types of data.

The components of the computing device may be implemented in circuitry. For example, the components may include and/or may be implemented using electronic circuits or other electronic hardware, which may include one or more programmable electronic circuits (e.g., microprocessors, graphics processing units (GPUs), digital signal processors (DSPs), central processing units (CPUs), and/or other suitable electronic circuits), and/or may include and/or be implemented using computer software, firmware, or any combination thereof, to perform the various operations described herein.

The process 1000 and the process 1100 are illustrated as a logical flow diagrams, the operation of which represent a sequence of operations that may be implemented in hardware, computer instructions, or a combination thereof. In the context of computer instructions, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular data types. The order in which the operations are described is not intended to be construed as a limitation, and any number of the described operations may be combined in any order and/or in parallel to implement the processes.

Additionally, the process 1000, the process 1100, and/or other process described herein, may be performed under the control of one or more computer systems configured with executable instructions and may be implemented as code (e.g., executable instructions, one or more computer programs, or one or more applications) executing collectively on one or more processors, by hardware, or combinations thereof. As noted above, the code may be stored on a computer-readable or machine-readable storage medium, for example, in the form of a computer program comprising a plurality of instructions executable by one or more processors. The computer-readable or machine-readable storage medium may be non-transitory.

Figure 12:
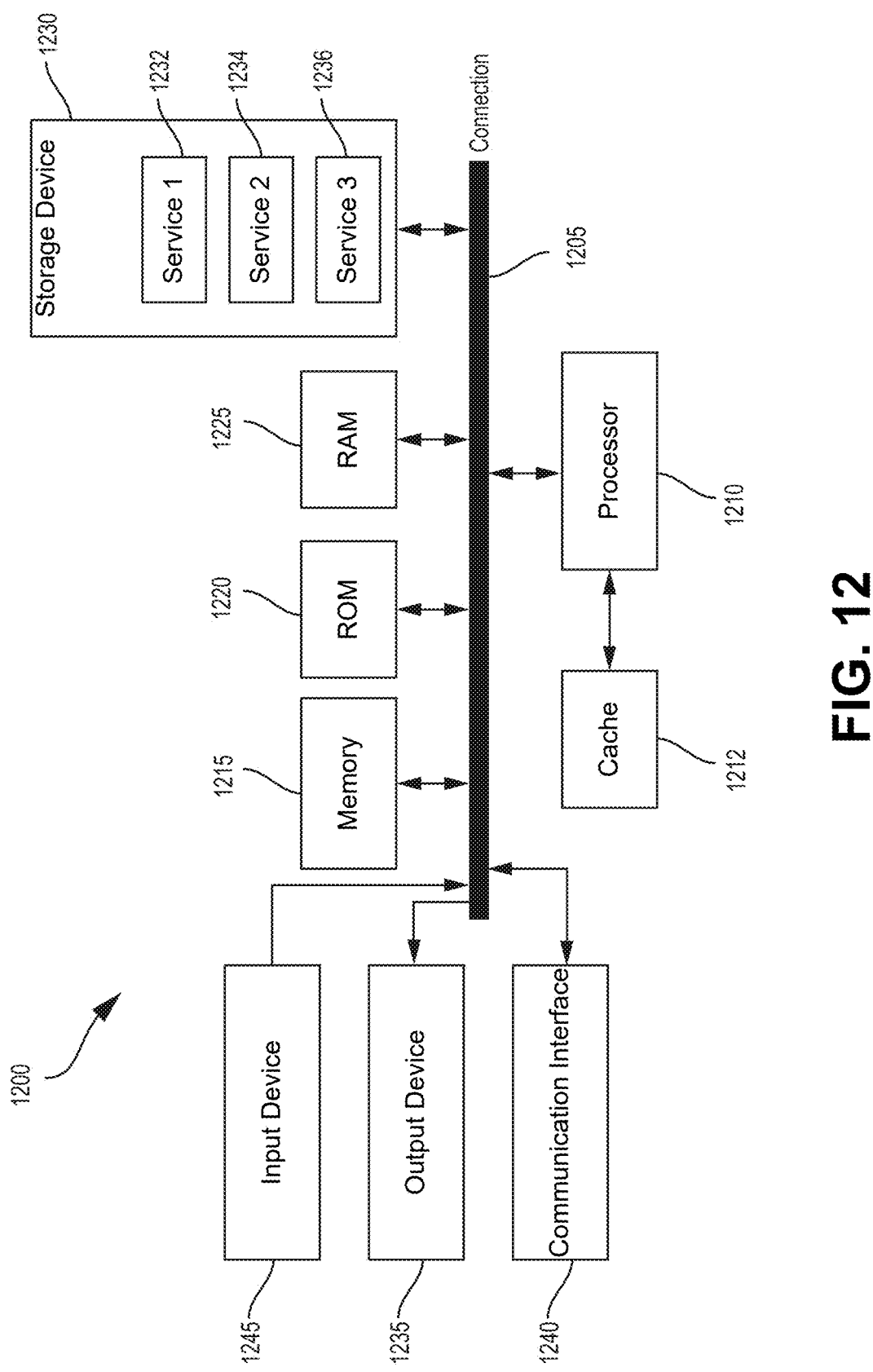
FIG. 12 is a block diagram illustrating an example of a computing system, which may be employed by the disclosed systems and techniques, in accordance with some examples.

FIG. 12 is a diagram illustrating an example of a system for implementing certain aspects of the present technology. In particular, FIG. 12 illustrates an example of computing system 1200, which may be for example any computing device making up internal computing system, a remote computing system, a camera, or any component thereof in which the components of the system are in communication with each other using connection 1205. Connection 1205 may be a physical connection using a bus, or a direct connection into processor 1210, such as in a chipset architecture. Connection 1205 may also be a virtual connection, networked connection, or logical connection.

In some aspects, computing system 1200 is a distributed system in which the functions described in this disclosure may be distributed within a datacenter, multiple data centers, a peer network, etc. In some aspects, one or more of the described system components represents many such components each performing some or all of the function for which the component is described. In some aspects, the components may be physical or virtual devices.

Example system 1200 includes at least one processing unit (CPU or processor) 1210 and connection 1205 that communicatively couples various system components including system memory 1215, such as read-only memory (ROM) 1220 and random access memory (RAM) 1225 to processor 1210. Computing system 1200 may include a cache 1215 of high-speed memory connected directly with, in close proximity to, or integrated as part of processor 1210.

Processor 1210 may include any general-purpose processor and a hardware service or software service, such as services 1232, 1234, and 1236 stored in storage device 1230, configured to control processor 1210 as well as a special-purpose processor where software instructions are incorporated into the actual processor design. Processor 1210 may essentially be a completely self-contained computing system, containing multiple cores or processors, a bus, memory controller, cache, etc. A multi-core processor may be symmetric or asymmetric.

To enable user interaction, computing system 1200 includes an input device 1245, which may represent any number of input mechanisms, such as a microphone for speech, a touch-sensitive screen for gesture or graphical input, keyboard, mouse, motion input, speech, etc. Computing system 1200 may also include output device 1235, which may be one or more of a number of output mechanisms. In some instances, multimodal systems may enable a user to provide multiple types of input/output to communicate with computing system 1200.

Computing system 1200 may include communications interface 1240, which may generally govern and manage the user input and system output. The communication interface may perform or facilitate receipt and/or transmission wired or wireless communications using wired and/or wireless transceivers, including those making use of an audio jack/plug, a microphone jack/plug, a universal serial bus (USB) port/plug, an Apple™ Lightning™ port/plug, an Ethernet port/plug, a fiber optic port/plug, a proprietary wired port/plug, 3G, 4G, 5G and/or other cellular data network wireless signal transfer, a Bluetooth™ wireless signal transfer, a Bluetooth™ low energy (BLE) wireless signal transfer, an IBEACON™ wireless signal transfer, a radio-frequency identification (RFID) wireless signal transfer, near-field communications (NFC) wireless signal transfer, dedicated short range communication (DSRC) wireless signal transfer, 802.11 Wi-Fi wireless signal transfer, wireless local area network (WLAN) signal transfer, Visible Light Communication (VLC), Worldwide Interoperability for Microwave Access (WiMAX), Infrared (IR) communication wireless signal transfer, Public Switched Telephone Network (PSTN) signal transfer, Integrated Services Digital Network (ISDN) signal transfer, ad-hoc network signal transfer, radio wave signal transfer, microwave signal transfer, infrared signal transfer, visible light signal transfer, ultraviolet light signal transfer, wireless signal transfer along the electromagnetic spectrum, or some combination thereof. The communications interface 1240 may also include one or more Global Navigation Satellite System (GNSS) receivers or transceivers that are used to determine a location of the computing system 1200 based on receipt of one or more signals from one or more satellites associated with one or more GNSS systems. GNSS systems include, but are not limited to, the US-based Global Positioning System (GPS), the Russia-based Global Navigation Satellite System (GLONASS), the China-based BeiDou Navigation Satellite System (BDS), and the Europe-based Galileo GNSS. There is no restriction on operating on any particular hardware arrangement, and therefore the basic features here may easily be substituted for improved hardware or firmware arrangements as they are developed.

Storage device 1230 may be a non-volatile and/or non-transitory and/or computer-readable memory device and may be a hard disk or other types of computer readable media which may store data that are accessible by a computer, such as magnetic cassettes, flash memory cards, solid state memory devices, digital versatile disks, cartridges, a floppy disk, a flexible disk, a hard disk, magnetic tape, a magnetic strip/stripe, any other magnetic storage medium, flash memory, memristor memory, any other solid-state memory, a compact disc read only memory (CD-ROM) optical disc, a rewritable compact disc (CD) optical disc, digital video disk (DVD) optical disc, a blu-ray disc (BDD) optical disc, a holographic optical disk, another optical medium, a secure digital (SD) card, a micro secure digital (microSD) card, a Memory Stick® card, a smartcard chip, a EMV chip, a subscriber identity module (SIM) card, a mini/micro/nano/pico SIM card, another integrated circuit (IC) chip/card, random access memory (RAM), static RAM (SRAM), dynamic RAM (DRAM), read-only memory (ROM), programmable read-only memory (PROM), erasable programmable read-only memory (EPROM), electrically erasable programmable read-only memory (EEPROM), flash EPROM (FLASHEPROM), cache memory (e.g., Level 1 (L1) cache, Level 2 (L2) cache, Level 3 (L3) cache, Level 4 (L4) cache, Level 5 (L5) cache, or other (L #) cache), resistive random-access memory (RRAM/ReRAM), phase change memory (PCM), spin transfer torque RAM (STT-RAM), another memory chip or cartridge, and/or a combination thereof.

The storage device 1230 may include software services, servers, services, etc., that when the code that defines such software is executed by the processor 1210, it causes the system to perform a function. In some aspects, a hardware service that performs a particular function may include the software component stored in a computer-readable medium in connection with the necessary hardware components, such as processor 1210, connection 1205, output device 1235, etc., to carry out the function. The term "computer-readable medium" includes, but is not limited to, portable or non-portable storage devices, optical storage devices, and various other mediums capable of storing, containing, or carrying instruction(s) and/or data. A computer-readable medium may include a non-transitory medium in which data may be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, memory or memory devices. A computer-readable medium may have stored thereon code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, or the like.

Specific details are provided in the description above to provide a thorough understanding of the aspects and examples provided herein, but those skilled in the art will recognize that the application is not limited thereto. Thus, while illustrative aspects of the application have been described in detail herein, it is to be understood that the inventive concepts may be otherwise variously embodied and employed, and that the appended claims are intended to be construed to include such variations, except as limited by the prior art. Various features and aspects of the above-described application may be used individually or jointly. Further, aspects may be utilized in any number of environments and applications beyond those described herein without departing from the broader scope of the specification. The specification and drawings are, accordingly, to be regarded as illustrative rather than restrictive. For the purposes of illustration, methods were described in a particular order. It should be appreciated that in alternate aspects, the methods may be performed in a different order than that described.

For clarity of explanation, in some instances the present technology may be presented as including individual functional blocks comprising devices, device components, steps or routines in a method embodied in software, or combinations of hardware and software. Additional components may be used other than those shown in the figures and/or described herein. For example, circuits, systems, networks, processes, and other components may be shown as components in block diagram form in order not to obscure the aspects in unnecessary detail. In other instances, well-known circuits, processes, algorithms, structures, and techniques may be shown without unnecessary detail in order to avoid obscuring the aspects.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Individual aspects may be described above as a process or method which is depicted as a flowchart, a flow diagram, a data flow diagram, a structure diagram, or a block diagram. Although a flowchart may describe the operations as a sequential process, many of the operations may be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination may correspond to a return of the function to the calling function or the main function.

Processes and methods according to the above-described examples may be implemented using computer-executable instructions that are stored or otherwise available from computer-readable media. Such instructions may include, for example, instructions and data which cause or otherwise configure a general purpose computer, special purpose computer, or a processing device to perform a certain function or group of functions. Portions of computer resources used may be accessible over a network. The computer executable instructions may be, for example, binaries, intermediate format instructions such as assembly language, firmware, source code. Examples of computer-readable media that may be used to store instructions, information used, and/or information created during methods according to described examples include magnetic or optical disks, flash memory, USB devices provided with non-volatile memory, networked storage devices, and so on.

In some aspects the computer-readable storage devices, mediums, and memories may include a cable or wireless signal containing a bitstream and the like. However, when mentioned, non-transitory computer-readable storage media expressly exclude media such as energy, carrier signals, electromagnetic waves, and signals per se.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof, in some cases depending in part on the particular application, in part on the desired design, in part on the corresponding technology, etc.

The various illustrative logical blocks, modules, and circuits described in connection with the aspects disclosed herein may be implemented or performed using hardware, software, firmware, middleware, microcode, hardware description languages, or any combination thereof, and may take any of a variety of form factors. When implemented in software, firmware, middleware, or microcode, the program code or code segments to perform the necessary tasks (e.g., a computer-program product) may be stored in a computer-readable or machine-readable medium. A processor(s) may perform the necessary tasks. Examples of form factors include laptops, smart phones, mobile phones, tablet devices or other small form factor personal computers, personal digital assistants, rackmount devices, standalone devices, and so on. Functionality described herein also may be embodied in peripherals or add-in cards. Such functionality may also be implemented on a circuit board among different chips or different processes executing in a single device, by way of further example.

The instructions, media for conveying such instructions, computing resources for executing them, and other structures for supporting such computing resources are example means for providing the functions described in the disclosure.

The techniques described herein may also be implemented in electronic hardware, computer software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the methods, algorithms, and/or operations described above. The computer-readable data storage medium may form part of a computer program product, which may include packaging materials. The computer-readable medium may comprise memory or data storage media, such as random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that may be accessed, read, and/or executed by a computer, such as propagated signals or waves.

The program code may be executed by a processor, which may include one or more processors, such as one or more digital signal processors (DSPs), general purpose microprocessors, an application specific integrated circuits (ASICs), field programmable logic arrays (FPGAs), or other equivalent integrated or discrete logic circuitry. Such a processor may be configured to perform any of the techniques described in this disclosure. A general-purpose processor may be a microprocessor; but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Accordingly, the term "processor," as used herein may refer to any of the foregoing structure, any combination of the foregoing structure, or any other structure or apparatus suitable for implementation of the techniques described herein.

One of ordinary skill will appreciate that the less than ("<") and greater than (">") symbols or terminology used herein may be replaced with less than or equal to ("≤") and greater than or equal to ("≥") symbols, respectively, without departing from the scope of this description.

Where components are described as being "configured to" perform certain operations, such configuration may be accomplished, for example, by designing electronic circuits or other hardware to perform the operation, by programming programmable electronic circuits (e.g., microprocessors, or other suitable electronic circuits) to perform the operation, or any combination thereof.

The phrase "coupled to" or "communicatively coupled to" refers to any component that is physically connected to another component either directly or indirectly, and/or any component that is in communication with another component (e.g., connected to the other component over a wired or wireless connection, and/or other suitable communication interface) either directly or indirectly.

Claim language or other language reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, A and B and C, or any duplicate information or data (e.g., A and A, B and B, C and C, A and A and B, and so on), or any other ordering, duplication, or combination of A, B, and C. The language "at least one of" a set and/or "one or more" of a set does not limit the set to the items listed in the set. For example, claim language reciting "at least one of A and B" or "at least one of A or B" may mean A, B, or A and B, and may additionally include items not listed in the set of A and B. The phrases "at least one" and "one or more" are used interchangeably herein.

Claim language or other language reciting "at least one processor configured to," "at least one processor being configured to," "one or more processors configured to," "one or more processors being configured to," or the like indicates that one processor or multiple processors (in any combination) can perform the associated operation(s). For example, claim language reciting "at least one processor configured to: X, Y, and Z" means a single processor can be used to perform operations X, Y, and Z; or that multiple processors are each tasked with a certain subset of operations X, Y, and Z such that together the multiple processors perform X, Y, and Z; or that a group of multiple processors work together to perform operations X, Y, and Z. In another example, claim language reciting "at least one processor configured to: X, Y, and Z" can mean that any single processor may only perform at least a subset of operations X, Y, and Z.

Where reference is made to one or more elements performing functions (e.g., steps of a method), one element may perform all functions, or more than one element may collectively perform the functions. When more than one element collectively performs the functions, each function need not be performed by each of those elements (e.g., different functions may be performed by different elements) and/or each function need not be performed in whole by only one element (e.g., different elements may perform different sub-functions of a function). Similarly, where reference is made to one or more elements configured to cause another element (e.g., an apparatus) to perform functions, one element may be configured to cause the other element to perform all functions, or more than one element may collectively be configured to cause the other element to perform the functions.

Where reference is made to an entity (e.g., any entity or device described herein) performing functions or being configured to perform functions (e.g., steps of a method), the entity may be configured to cause one or more elements (individually or collectively) to perform the functions. The one or more components of the entity may include at least one memory, at least one processor, at least one communication interface, another component configured to perform one or more (or all) of the functions, and/or any combination thereof. Where reference to the entity performing functions, the entity may be configured to cause one component to perform all functions, or to cause more than one component to collectively perform the functions. When the entity is configured to cause more than one component to collectively perform the functions, each function need not be performed by each of those components (e.g., different functions may be performed by different components) and/or each function need not be performed in whole by only one component (e.g., different components may perform different sub-functions of a function).

Illustrative aspects of the disclosure include:

Aspect 1. A network device for wireless communication, comprising: at least one memory; and at least one processor coupled to the at least one memory, wherein the network device is configured to: receive configuration information for redundancy bits associated with scheduled non-coherent transmissions; receive a plurality of non-coherent transmissions corresponding to a message, the message including a plurality of data bits and a plurality of redundancy bits, wherein each non-coherent transmission of the plurality of non-coherent transmissions is associated with a duty cycle corresponding to the scheduled non-coherent transmissions; and determine error control information for one or more data bits of the plurality of data bits using corresponding redundancy bits of the plurality of redundancy bits, wherein the corresponding redundancy bits are determined based on the configuration information.

Aspect 2. The network device of Aspect 1, wherein: the plurality of redundancy bits includes one or more cyclic redundancy check (CRC) bits corresponding to a respective CRC determined for each non-coherent transmission of the plurality of non-coherent transmissions.

Aspect 3. The network device of Aspect 2, wherein the respective CRC determined for each non-coherent transmission of the plurality of non-coherent transmissions comprises a CRC determined for corresponding data bits included in each non-coherent transmission, the corresponding data bits included in the plurality of data bits and indicative of a symbol represented by each non-coherent transmission.

Aspect 4. The network device of Aspect 3, wherein the one or more CRC bits corresponding to the respective CRC determined for each non-coherent transmission are interleaved with the corresponding data bits included in each non-coherent transmission.

Aspect 5. The network device of any of Aspects 3 to 4, wherein each non-coherent transmission of the plurality of non-coherent transmissions comprises: the corresponding data bits indicative of the symbol represented by each non-coherent transmission; and the one or more CRC bits corresponding to the respective CRC determined for each non-coherent transmission, wherein the one or more CRC bits are based on the corresponding data bits.

Aspect 6. The network device of any of Aspects 2 to 5, wherein the network device is configured to determine respective error control information for each non-coherent transmission of the plurality of non-coherent transmissions, based on corresponding data bits of each non-coherent transmission and the one or more CRC bits corresponding to the respective CRC for each non-coherent transmission.

Aspect 7. The network device of Aspect 6, wherein the respective error control information for each non-coherent transmission of the plurality of non-coherent transmissions is determined before a next transmission of the plurality of non-coherent transmissions is received.

Aspect 8. The network device of any of Aspects 1 to 7, wherein: the plurality of redundancy bits includes a plurality of cyclic redundancy check (CRC) bits corresponding to a CRC determined for the plurality of data bits included in the message; and the plurality of redundancy bits are multiplexed with the plurality of non-coherent transmissions using a multiplexing pattern.

Aspect 9. The network device of Aspect 8, wherein a first transmission of the plurality of non-coherent transmissions does not include CRC bits corresponding to the CRC.

Aspect 10. The network device of any of Aspects 8 to 9, wherein the network device is configured to determine the error control information for the plurality of data bits included in the message, wherein the error control information is determined after all transmissions of the plurality of non-coherent transmissions are received.

Aspect 11. The network device of any of Aspects 1 to 10, wherein the plurality of non-coherent transmissions comprises a plurality of symbols, each symbol of the plurality of symbols transmitted using the duty cycle.

Aspect 12. The network device of any of Aspects 1 to 11, wherein each non-coherent transmission of the plurality of non-coherent transmissions is a peaky symbol received without channel state information (CSI) acquisition by the network device.

Aspect 13. The network device of any of Aspects 1 to 12, wherein each non-coherent transmission of the plurality of non-coherent transmissions is a peaky symbol received without a corresponding demodulation reference signal (DMRS) or pilot signal reception by the network device.

Aspect 14. The network device of any of Aspects 1 to 13, wherein a transmission gap between consecutive transmissions of the plurality of non-coherent transmissions is based on the duty cycle.

Aspect 15. The network device of any of Aspects 1 to 14, wherein the plurality of redundancy bits includes a plurality of cyclic redundancy check (CRC) bits, and wherein the error control information comprises a CRC checksum value.

Aspect 16. The network device of Aspect 15, wherein the plurality of redundancy bits further includes one or more forward error correction (FEC) bits, and wherein the error control information further comprises one or more error corrections based on the one or more FEC bits.

Aspect 17. The network device of any of Aspects 1 to 16, wherein the plurality of redundancy bits includes a plurality of forward error correction (FEC) bits, and wherein the error control information comprises one or more error corrections determined based on the plurality of FEC bits and data bits decoded from the plurality of non-coherent transmissions.

Aspect 18. The network device of any of Aspects 1 to 17, wherein the configuration information for the redundancy bits comprises dynamic configuration information received by the network device in Layer 1 (L1) signaling information.

Aspect 19. The network device of any of Aspects 1 to 18, wherein the configuration information for the redundancy bits comprises semi-static configuration information received by the network device in a radio resource control (RRC) configuration.

Aspect 20. The network device of any of Aspects 1 to 19, wherein the network device is configured to: receive, from an additional network device, the configuration information for the redundancy bits associated with scheduled non-coherent transmissions; and receive, from the additional network device, the plurality of non-coherent transmissions corresponding to the message.

Aspect 21. The network device of Aspect 20, wherein the network device is configured to: transmit, to the additional network device, a retransmission request based on one or more detected errors within the error control information.

Aspect 22. The network device of Aspect 21, wherein: the configuration information is indicative of scheduled non-coherent transmissions by the additional network device using per-transmission attachment between respective redundancy bits of the plurality of redundancy bits and each non-coherent transmission of the plurality of non-coherent transmissions; and the retransmission request is a request to the additional network device for retransmission of a particular transmission of the plurality of non-coherent transmissions, wherein the one or more detected errors correspond to data bits within the particular transmission.

Aspect 23. The network device of any of Aspects 21 to 22, wherein: the configuration information is indicative of scheduled non-coherent transmissions by the additional network device using per-message attachment between the plurality of redundancy bits and the plurality of non-coherent transmissions corresponding to the message; and the retransmission request is a request to the additional network device for retransmission of the plurality of non-coherent transmissions corresponding to the message.

Aspect 24. A method for wireless communication by a network device, the method comprising: receiving configuration information for redundancy bits associated with scheduled non-coherent transmissions; receiving a plurality of non-coherent transmissions corresponding to a message, the message including a plurality of data bits and a plurality of redundancy bits, wherein each non-coherent transmission of the plurality of non-coherent transmissions is associated with a duty cycle corresponding to the scheduled non-coherent transmissions; and determining error control information for one or more data bits of the plurality of data bits using corresponding redundancy bits of the plurality of redundancy bits, wherein the corresponding redundancy bits are determined based on the configuration information.

Aspect 25. The method of Aspect 24, wherein: the plurality of redundancy bits includes one or more cyclic redundancy check (CRC) bits corresponding to a respective CRC determined for each non-coherent transmission of the plurality of non-coherent transmissions.

Aspect 26. The method of Aspect 25, wherein the respective CRC determined for each non-coherent transmission of the plurality of non-coherent transmissions comprises a CRC determined for corresponding data bits included in each non-coherent transmission, the corresponding data bits included in the plurality of data bits and indicative of a symbol represented by each non-coherent transmission.

Aspect 27. The method of Aspect 26, wherein the one or more CRC bits corresponding to the respective CRC determined for each non-coherent transmission are interleaved with the corresponding data bits included in each non-coherent transmission.

Aspect 28. The method of any of Aspects 26 to 27, wherein each non-coherent transmission of the plurality of non-coherent transmissions comprises: the corresponding data bits indicative of the symbol represented by each non-coherent transmission; and the one or more CRC bits corresponding to the respective CRC determined for each non-coherent transmission, wherein the one or more CRC bits are based on the corresponding data bits.

Aspect 29. The method of any of Aspects 25 to 28, further comprising determining respective error control information for each non-coherent transmission of the plurality of non-coherent transmissions based on corresponding data bits of each non-coherent transmission and the one or more CRC bits corresponding to the respective CRC for each non-coherent transmission.

Aspect 30. The method of Aspect 29, wherein the respective error control information for each non-coherent transmission of the plurality of non-coherent transmissions is determined before a next transmission of the plurality of non-coherent transmissions is received.

Aspect 31. The method of any of Aspects 24 to 30, wherein: the plurality of redundancy bits includes a plurality of cyclic redundancy check (CRC) bits corresponding to a CRC determined for the plurality of data bits included in the message; and the plurality of redundancy bits are multiplexed with the plurality of non-coherent transmissions using a multiplexing pattern.

Aspect 32. The method of Aspect 31, wherein a first transmission of the plurality of non-coherent transmissions does not include CRC bits corresponding to the CRC.

Aspect 33. The method of any of Aspects 31 to 32, further comprising determining the error control information for the plurality of data bits included in the message after all transmissions of the plurality of non-coherent transmissions are received.

Aspect 34. The method of any of Aspects 24 to 33, wherein the plurality of non-coherent transmissions comprises a plurality of symbols, each symbol of the plurality of symbols transmitted using the duty cycle.

Aspect 35. The method of any of Aspects 24 to 34, wherein each non-coherent transmission of the plurality of non-coherent transmissions is a peaky symbol received without channel state information (CSI) acquisition by the network device.

Aspect 36. The method of any of Aspects 24 to 35, wherein each non-coherent transmission of the plurality of non-coherent transmissions is a peaky symbol received without a corresponding demodulation reference signal (DMRS) or pilot signal reception by the network device.

Aspect 37. The method of any of Aspects 24 to 36, wherein a transmission gap between consecutive transmissions of the plurality of non-coherent transmissions is based on the duty cycle.

Aspect 38. The method of any of Aspects 24 to 37, wherein the plurality of redundancy bits includes a plurality of cyclic redundancy check (CRC) bits, and wherein the error control information comprises a CRC checksum value.

Aspect 39. The method of Aspect 38, wherein the plurality of redundancy bits further includes one or more forward error correction (FEC) bits, and wherein the error control information further comprises one or more error corrections based on the one or more FEC bits.

Aspect 40. The method of any of Aspects 24 to 39, wherein the plurality of redundancy bits includes a plurality of forward error correction (FEC) bits, and wherein the error control information comprises one or more error corrections determined based on the plurality of FEC bits and data bits decoded from the plurality of non-coherent transmissions.

Aspect 41. The method of any of Aspects 24 to 40, wherein the configuration information for the redundancy bits comprises dynamic configuration information received by the network device in Layer 1 (L1) signaling information.

Aspect 42. The method of any of Aspects 24 to 41, wherein the configuration information for the redundancy bits comprises semi-static configuration information received by the network device in a radio resource control (RRC) configuration.

Aspect 43. The method of any of Aspects 24 to 42, further comprising: receiving, from an additional network device, the configuration information for the redundancy bits associated with scheduled non-coherent transmissions; and receiving, from the additional network device, the plurality of non-coherent transmissions corresponding to the message.

Aspect 44. The method of Aspect 43, further comprising: transmitting, to the additional network device, a retransmission request based on one or more detected errors within the error control information.

Aspect 45. The method of Aspect 44, wherein: the configuration information is indicative of scheduled non-coherent transmissions by the additional network device using per-transmission attachment between respective redundancy bits of the plurality of redundancy bits and each non-coherent transmission of the plurality of non-coherent transmissions; and the retransmission request is a request to the additional network device for retransmission of a particular transmission of the plurality of non-coherent transmissions, wherein the one or more detected errors correspond to data bits within the particular transmission.

Aspect 46. The method of any of Aspects 44 to 45, wherein: the configuration information is indicative of scheduled non-coherent transmissions by the additional network device using per-message attachment between the plurality of redundancy bits and the plurality of non-coherent transmissions corresponding to the message; and the retransmission request is a request to the additional network device for retransmission of the plurality of non-coherent transmissions corresponding to the message.

Aspect 47. A method for wireless communication, comprising performing operations according to any of Aspects 1 to 23.

Aspect 48. A non-transitory computer-readable storage medium comprising instructions stored thereon which, when executed by at least one processor, causes the at least one processor to perform operations according to any of Aspects 1 to 23.

Aspect 49. A non-transitory computer-readable storage medium comprising instructions stored thereon which, when executed by at least one processor, causes the at least one processor to perform operations according to any of Aspects 24 to 46.

Aspect 50. An apparatus for wireless communication comprising one or more means for performing operations according to any of Aspects 1 to 23.

Aspect 51. An apparatus for wireless communication comprising one or more means for performing operations according to any of Aspects 24 to 46.

What is claimed is:

1. A network device for wireless communication, comprising:
   at least one memory; and
   at least one processor coupled to the at least one memory, wherein the network device is configured to:
      receive configuration information for redundancy bits associated with scheduled non-coherent transmissions;
      receive a plurality of non-coherent transmissions corresponding to a message, the message including a plurality of data bits and a plurality of redundancy bits, wherein each non-coherent transmission of the plurality of non-coherent transmissions is associated with a duty cycle corresponding to the scheduled non-coherent transmissions; and
      determine error control information for one or more data bits of the plurality of data bits using corresponding redundancy bits of the plurality of redundancy bits, wherein the corresponding redundancy bits are determined based on the configuration information.

2. The network device of claim 1, wherein:
   the plurality of redundancy bits includes one or more cyclic redundancy check (CRC) bits corresponding to a respective CRC determined for each non-coherent transmission of the plurality of non-coherent transmissions.

3. The network device of claim 2, wherein the respective CRC determined for each non-coherent transmission of the plurality of non-coherent transmissions comprises a CRC determined for corresponding data bits included in each non-coherent transmission, the corresponding data bits included in the plurality of data bits and indicative of a symbol represented by each non-coherent transmission.

4. The network device of claim 3, wherein the one or more CRC bits corresponding to the respective CRC determined for each non-coherent transmission are interleaved with the corresponding data bits included in each non-coherent transmission.

5. The network device of claim 3, wherein each non-coherent transmission of the plurality of non-coherent transmissions comprises:
   the corresponding data bits indicative of the symbol represented by each non-coherent transmission; and
   the one or more CRC bits corresponding to the respective CRC determined for each non-coherent transmission, wherein the one or more CRC bits are based on the corresponding data bits.

6. The network device of claim 2, wherein the network device is configured to determine respective error control information for each non-coherent transmission of the plurality of non-coherent transmissions, based on corresponding data bits of each non-coherent transmission and the one or more CRC bits corresponding to the respective CRC for each non-coherent transmission.

7. The network device of claim 6, wherein the respective error control information for each non-coherent transmission of the plurality of non-coherent transmissions is determined before a next transmission of the plurality of non-coherent transmissions is received.

8. The network device of claim 1, wherein:
   the plurality of redundancy bits includes a plurality of cyclic redundancy check (CRC) bits corresponding to a CRC determined for the plurality of data bits included in the message; and
   the plurality of redundancy bits are multiplexed with the plurality of non-coherent transmissions using a multiplexing pattern.

9. The network device of claim 8, wherein a first transmission of the plurality of non-coherent transmissions does not include CRC bits corresponding to the CRC.

10. The network device of claim 8, wherein the network device is configured to determine the error control information for the plurality of data bits included in the message, wherein the error control information is determined after all transmissions of the plurality of non-coherent transmissions are received.

11. The network device of claim 1, wherein the plurality of non-coherent transmissions comprises a plurality of symbols, each symbol of the plurality of symbols transmitted using the duty cycle.

12. The network device of claim 1, wherein each non-coherent transmission of the plurality of non-coherent transmissions is a peaky symbol received without channel state information (CSI) acquisition by the network device.

13. The network device of claim 1, wherein the plurality of redundancy bits includes a plurality of cyclic redundancy check (CRC) bits, and wherein the error control information comprises a CRC checksum value.

14. The network device of claim 13, wherein the plurality of redundancy bits further includes one or more forward error correction (FEC) bits, and wherein the error control information further comprises one or more error corrections based on the one or more FEC bits.

15. The network device of claim 1, wherein the plurality of redundancy bits includes a plurality of forward error correction (FEC) bits, and wherein the error control information comprises one or more error corrections determined based on the plurality of FEC bits and data bits decoded from the plurality of non-coherent transmissions.

16. The network device of claim 1, wherein the configuration information for the redundancy bits comprises dynamic configuration information received by the network device in Layer 1 (L1) signaling information or semi-static configuration information received by the network device in a radio resource control (RRC) configuration.

17. The network device of claim 1, wherein the network device is configured to:

receive, from an additional network device, the configuration information for the redundancy bits associated with scheduled non-coherent transmissions; and receive, from the additional network device, the plurality of non-coherent transmissions corresponding to the message.

18. The network device of claim 17, wherein:

the network device is configured to transmit, to the additional network device, a retransmission request based on one or more detected errors within the error control information;

the configuration information is indicative of scheduled non-coherent transmissions by the additional network device using per-transmission attachment between respective redundancy bits of the plurality of redundancy bits and each non-coherent transmission of the plurality of non-coherent transmissions; and the retransmission request is a request to the additional network device for retransmission of a particular transmission of the plurality of non-coherent transmissions, wherein the one or more detected errors correspond to data bits within the particular transmission.

19. The network device of claim 17, wherein:

the network device is configured to transmit, to the additional network device, a retransmission request based on one or more detected errors within the error control information;

the configuration information is indicative of scheduled non-coherent transmissions by the additional network device using per-message attachment between the plurality of redundancy bits and the plurality of non-coherent transmissions corresponding to the message; and the retransmission request is a request to the additional network device for retransmission of the plurality of non-coherent transmissions corresponding to the message.

20. A method for wireless communication by a network device, the method comprising:

receiving configuration information for redundancy bits associated with scheduled non-coherent transmissions;

receiving a plurality of non-coherent transmissions corresponding to a message, the message including a plurality of data bits and a plurality of redundancy bits, wherein each non-coherent transmission of the plurality of non-coherent transmissions is associated with a duty cycle corresponding to the scheduled non-coherent transmissions; and determining error control information for one or more data bits of the plurality of data bits using corresponding redundancy bits of the plurality of redundancy bits, wherein the corresponding redundancy bits are determined based on the configuration information.

* * * * *